United States Patent
Pinarbasi et al.

(10) Patent No.: US 11,355,699 B2
(45) Date of Patent: Jun. 7, 2022

(54) PRECESSIONAL SPIN CURRENT STRUCTURE FOR MRAM

(71) Applicant: Integrated Silicon Solution, (Cayman) Inc., Grand Cayman (KY)

(72) Inventors: Mustafa Pinarbasi, Morgan Hill, CA (US); Bartlomiej Adam Kardasz, Pleasanton, CA (US)

(73) Assignee: Integrated Silicon Solution, (Cayman) Inc., Grand Cayman (KY)

( * ) Notice: Subject to any disclaimer, the term of this patent is extended or adjusted under 35 U.S.C. 154(b) by 162 days.

(21) Appl. No.: 16/818,472

(22) Filed: Mar. 13, 2020

(65) Prior Publication Data

US 2020/0220070 A1 Jul. 9, 2020

Related U.S. Application Data

(63) Continuation of application No. 15/445,260, filed on Feb. 28, 2017, now Pat. No. 10,672,976.

(51) Int. Cl.
*H01L 43/08* (2006.01)
*H01L 43/10* (2006.01)
*H01L 43/12* (2006.01)

(52) U.S. Cl.
CPC ............ *H01L 43/08* (2013.01); *H01L 43/10* (2013.01); *H01L 43/12* (2013.01)

(58) Field of Classification Search
CPC ......... H01L 43/02; H01L 43/08; H01L 43/10; H01L 43/12; H01L 29/66984; G11C 11/161; H01F 10/32–3295; H03B 15/006; G02F 2203/16

USPC ........................................................ 257/421
See application file for complete search history.

(56) References Cited

U.S. PATENT DOCUMENTS

| | | |
|---|---|---|
| 341,801 A | 5/1886 | Fox |
| 5,541,868 A | 7/1996 | Prinz |
| 5,629,549 A | 5/1997 | Johnson |
| 5,640,343 A | 6/1997 | Gallagher et al. |
| 5,654,566 A | 8/1997 | Johnson |
| 5,691,936 A | 11/1997 | Sakakima et al. |
| 5,695,846 A | 12/1997 | Lange et al. |

(Continued)

FOREIGN PATENT DOCUMENTS

| | | |
|---|---|---|
| CA | 2766141 A1 | 1/2011 |
| CN | 1905153 A | 1/2007 |

(Continued)

OTHER PUBLICATIONS

Extended European Search Report dated Nov. 23, 2020 in EU Application No. 18761833.5.

(Continued)

*Primary Examiner* — Nelson Garces

(57) ABSTRACT

A magnetoresistive random-access memory (MRAM) is disclosed. MRAM device has a magnetic tunnel junction stack having a significantly improved performance of the free layer in the magnetic tunnel junction structure. The MRAM device utilizes a precessional spin current (PSC) magnetic layer in conjunction with a perpendicular MTJ where the in-plane magnetization direction of the PSC magnetic layer is free to rotate. The precessional spin current magnetic layer is constructed with a material having a face centered cubic crystal structure, such as permalloy.

21 Claims, 14 Drawing Sheets

(56) References Cited

U.S. PATENT DOCUMENTS

| | | |
|---|---|---|
| 5,695,864 A | 12/1997 | Slonczewski |
| 5,732,016 A | 3/1998 | Chen et al. |
| 5,856,897 A | 1/1999 | Mauri |
| 5,896,252 A | 4/1999 | Kanai |
| 5,966,323 A | 10/1999 | Chen et al. |
| 6,016,269 A | 1/2000 | Peterson et al. |
| 6,055,179 A | 4/2000 | Koganei et al. |
| 6,097,579 A | 8/2000 | Gill |
| 6,124,711 A | 9/2000 | Tanaka et al. |
| 6,134,138 A | 10/2000 | Lu et al. |
| 6,140,838 A | 10/2000 | Johnson |
| 6,154,349 A | 11/2000 | Kanai et al. |
| 6,172,902 B1 | 1/2001 | Wegrowe et al. |
| 6,233,172 B1 | 5/2001 | Chen et al. |
| 6,243,288 B1 | 6/2001 | Ishikawa et al. |
| 6,252,798 B1 | 6/2001 | Satoh et al. |
| 6,256,223 B1 | 7/2001 | Sun |
| 6,272,036 B1 | 8/2001 | You et al. |
| 6,292,389 B1 | 9/2001 | Chen et al. |
| 6,347,049 B1 | 2/2002 | Childress et al. |
| 6,376,260 B1 | 4/2002 | Chen et al. |
| 6,385,082 B1 | 5/2002 | Abraham et al. |
| 6,436,526 B1 | 8/2002 | Odagawa et al. |
| 6,458,603 B1 | 10/2002 | Kersch et al. |
| 6,493,197 B2 | 12/2002 | Ito et al. |
| 6,522,137 B1 | 2/2003 | Sun et al. |
| 6,532,164 B2 | 3/2003 | Redon et al. |
| 6,538,918 B2 | 3/2003 | Swanson et al. |
| 6,545,906 B1 | 4/2003 | Savtchenko et al. |
| 6,563,681 B1 | 5/2003 | Sasaki et al. |
| 6,566,246 B1 | 5/2003 | deFelipe et al. |
| 6,603,677 B2 | 8/2003 | Redon et al. |
| 6,653,154 B2 | 11/2003 | Doan et al. |
| 6,654,278 B1 | 11/2003 | Engel et al. |
| 6,677,165 B1 | 1/2004 | Lu et al. |
| 6,710,984 B1 | 3/2004 | Yuasa et al. |
| 6,713,195 B2 | 3/2004 | Wang et al. |
| 6,714,444 B2 | 3/2004 | Huai et al. |
| 6,744,086 B2 | 6/2004 | Daughton et al. |
| 6,750,491 B2 | 6/2004 | Sharma et al. |
| 6,765,824 B2 | 7/2004 | Kishi et al. |
| 6,773,515 B2 | 8/2004 | Li et al. |
| 6,777,730 B2 | 8/2004 | Daughton et al. |
| 6,785,159 B2 | 8/2004 | Tuttle |
| 6,812,437 B2 | 11/2004 | Levy et al. |
| 6,829,161 B2 | 12/2004 | Huai et al. |
| 6,835,423 B2 | 12/2004 | Chen et al. |
| 6,838,740 B2 | 1/2005 | Huai et al. |
| 6,842,317 B2 | 1/2005 | Sugita et al. |
| 6,847,547 B2 | 1/2005 | Albert et al. |
| 6,887,719 B2 | 5/2005 | Lu et al. |
| 6,888,742 B1 | 5/2005 | Nguyen et al. |
| 6,902,807 B1 | 6/2005 | Argoitia et al. |
| 6,906,369 B2 | 6/2005 | Ross et al. |
| 6,920,063 B2 | 7/2005 | Huai et al. |
| 6,933,155 B2 | 8/2005 | Albert et al. |
| 6,958,927 B1 | 10/2005 | Nguyen et al. |
| 6,967,863 B2 | 11/2005 | Huai |
| 6,980,469 B2 | 12/2005 | Kent et al. |
| 6,985,385 B2 | 1/2006 | Nguyen et al. |
| 6,992,359 B2 | 1/2006 | Nguyen et al. |
| 6,995,962 B2 | 2/2006 | Saito et al. |
| 7,002,839 B2 | 2/2006 | Kawabata et al. |
| 7,005,958 B2 | 2/2006 | Wan |
| 7,006,375 B2 | 2/2006 | Covington |
| 7,009,877 B1 | 3/2006 | Huai et al. |
| 7,041,598 B2 | 5/2006 | Sharma |
| 7,045,368 B2 | 5/2006 | Hong et al. |
| 7,149,106 B2 | 12/2006 | Mancoff et al. |
| 7,170,778 B2 | 1/2007 | Kent et al. |
| 7,190,611 B2 | 3/2007 | Nguyen et al. |
| 7,203,129 B2 | 4/2007 | Lin et al. |
| 7,227,773 B1 | 6/2007 | Nguyen et al. |
| 7,262,941 B2 | 8/2007 | Li et al. |
| 7,307,876 B2 | 12/2007 | Kent et al. |
| 7,324,387 B1 | 1/2008 | Bergemont et al. |
| 7,335,960 B2 | 2/2008 | Han et al. |
| 7,351,594 B2 | 4/2008 | Bae et al. |
| 7,352,021 B2 | 4/2008 | Bae et al. |
| 7,376,006 B2 | 5/2008 | Bednorz et al. |
| 7,378,699 B2 | 5/2008 | Chan et al. |
| 7,449,345 B2 | 11/2008 | Horng et al. |
| 7,476,919 B2 | 1/2009 | Hong et al. |
| 7,502,249 B1 | 3/2009 | Ding |
| 7,573,737 B2 | 8/2009 | Kent et al. |
| 7,598,555 B1 | 10/2009 | Papworth-Parkin |
| 7,619,431 B2 | 11/2009 | DeWilde et al. |
| 7,630,232 B2 | 12/2009 | Guo |
| 7,643,332 B2 | 1/2010 | Leuschner |
| 7,679,155 B2 | 3/2010 | Korenivski |
| 7,911,832 B2 | 3/2011 | Kent et al. |
| 7,936,595 B2 | 5/2011 | Han et al. |
| 7,986,544 B2 | 7/2011 | Kent et al. |
| 8,014,193 B2 | 9/2011 | Nakayama et al. |
| 8,279,663 B2 | 10/2012 | Nakayama et al. |
| 8,279,666 B2 | 10/2012 | Dieny et al. |
| 8,334,213 B2 | 12/2012 | Mao |
| 8,357,982 B2 | 1/2013 | Kajiyama |
| 8,363,465 B2 | 1/2013 | Kent et al. |
| 8,456,883 B1 | 6/2013 | Liu |
| 8,488,375 B2 | 7/2013 | Saida et al. |
| 8,492,881 B2 | 7/2013 | Kuroiwa et al. |
| 8,508,979 B2 | 8/2013 | Saida et al. |
| 8,535,952 B2 | 9/2013 | Ranjan et al. |
| 8,574,928 B2 | 11/2013 | Satoh et al. |
| 8,576,616 B2 | 11/2013 | Saida et al. |
| 8,582,355 B2 | 11/2013 | Saida et al. |
| 8,617,408 B2 | 12/2013 | Balamane |
| 8,716,817 B2 | 5/2014 | Saida et al. |
| 8,737,122 B2 | 5/2014 | Saida et al. |
| 8,737,137 B1 | 5/2014 | Choy et al. |
| 8,779,537 B2 | 7/2014 | Huai |
| 8,823,118 B2 | 9/2014 | Horng |
| 8,852,760 B2 | 10/2014 | Wang et al. |
| 8,860,156 B2 | 10/2014 | Beach |
| 8,878,317 B2 | 11/2014 | Daibou et al. |
| 9,019,754 B1 | 4/2015 | Bedeschi |
| 9,025,368 B2 | 5/2015 | Saida et al. |
| 9,082,888 B2 | 7/2015 | Kent et al. |
| 9,117,995 B2 | 8/2015 | Daibou et al. |
| 9,129,690 B2 | 9/2015 | Park et al. |
| 9,159,342 B2 | 10/2015 | Kudo et al. |
| 9,245,608 B2 | 1/2016 | Chen et al. |
| 9,263,667 B1 | 2/2016 | Pinarbasi |
| 9,299,918 B2 | 3/2016 | Daibou et al. |
| 9,337,412 B2 | 5/2016 | Pinarbasi et al. |
| 9,362,486 B2 | 6/2016 | Kim et al. |
| 9,378,817 B2 | 6/2016 | Lee et al. |
| 9,379,314 B2 | 6/2016 | Park |
| 9,406,876 B2 | 8/2016 | Pinarbasi |
| 9,472,282 B2 | 10/2016 | Lee et al. |
| 9,472,748 B2 | 10/2016 | Kuo et al. |
| 9,484,527 B2 | 11/2016 | Han et al. |
| 9,548,445 B2 | 1/2017 | Lee et al. |
| 9,589,616 B2 | 3/2017 | Meng et al. |
| 9,728,712 B2 | 8/2017 | Kardasz et al. |
| 9,741,926 B1 | 8/2017 | Pinarbasi et al. |
| 9,773,540 B2 | 9/2017 | Zang et al. |
| 9,773,974 B2 | 9/2017 | Pinarbasi et al. |
| 9,777,974 B2 | 10/2017 | Kamitani et al. |
| 9,818,464 B2 | 11/2017 | Saida et al. |
| 9,853,206 B2 | 12/2017 | Pinarbasi et al. |
| 10,008,248 B2 | 6/2018 | Buhrman et al. |
| 10,026,892 B2 | 7/2018 | Pinarbasi et al. |
| 10,032,978 B1 | 7/2018 | Schabes et al. |
| 10,229,724 B1 | 3/2019 | el Baraji et al. |
| 10,236,047 B1 | 3/2019 | Ryan et al. |
| 10,236,048 B1 | 3/2019 | Tzoufras et al. |
| 10,236,439 B1 | 3/2019 | Schabes et al. |
| 10,270,027 B1 | 4/2019 | Gajek et al. |
| 10,360,961 B1 | 7/2019 | Tzoufras et al. |
| 10,468,588 B2 | 11/2019 | Schabes et al. |
| 10,468,590 B2 | 11/2019 | Kardasz et al. |
| 10,580,827 B1 | 3/2020 | Watts et al. |

(56) References Cited

U.S. PATENT DOCUMENTS

| | | | |
|---|---|---|---|
| 10,615,335 B2 | 4/2020 | Kardasz et al. | |
| 10,643,680 B2 | 5/2020 | Pinarbasi et al. | |
| 10,672,876 B2 | 6/2020 | Pinarbasi et al. | |
| 10,672,976 B2* | 6/2020 | Pinarbasi | G11C 11/161 |
| 10,777,736 B2 | 9/2020 | Pinarbasi et al. | |
| 2002/0090533 A1 | 7/2002 | Zhang et al. | |
| 2002/0105823 A1 | 8/2002 | Redon et al. | |
| 2002/0132140 A1 | 9/2002 | Igarashi et al. | |
| 2003/0117840 A1 | 6/2003 | Sharma et al. | |
| 2003/0151944 A1 | 8/2003 | Saito | |
| 2003/0197984 A1 | 10/2003 | Inomata et al. | |
| 2003/0218903 A1 | 11/2003 | Luo | |
| 2004/0012994 A1 | 1/2004 | Slaughter et al. | |
| 2004/0061154 A1 | 4/2004 | Huai et al. | |
| 2004/0094785 A1 | 5/2004 | Zhu et al. | |
| 2004/0125649 A1 | 7/2004 | Durlam et al. | |
| 2004/0130936 A1 | 7/2004 | Nguyen et al. | |
| 2004/0257717 A1 | 12/2004 | Sharma et al. | |
| 2005/0041342 A1 | 2/2005 | Huai et al. | |
| 2005/0051820 A1 | 3/2005 | Stojakovic et al. | |
| 2005/0063222 A1 | 3/2005 | Huai et al. | |
| 2005/0104101 A1 | 5/2005 | Sun et al. | |
| 2005/0128842 A1 | 6/2005 | Wei | |
| 2005/0136600 A1 | 6/2005 | Huai | |
| 2005/0158881 A1 | 7/2005 | Sharma | |
| 2005/0174702 A1 | 8/2005 | Gill | |
| 2005/0180202 A1 | 8/2005 | Huai et al. | |
| 2005/0184839 A1 | 8/2005 | Nguyen et al. | |
| 2005/0201023 A1 | 9/2005 | Huai et al. | |
| 2005/0237787 A1 | 10/2005 | Huai et al. | |
| 2005/0280058 A1 | 12/2005 | Pakala et al. | |
| 2006/0002184 A1 | 1/2006 | Hong et al. | |
| 2006/0018057 A1 | 1/2006 | Huai | |
| 2006/0044703 A1 | 3/2006 | Inomata et al. | |
| 2006/0049472 A1 | 3/2006 | Diao et al. | |
| 2006/0087880 A1 | 4/2006 | Mancoff et al. | |
| 2006/0092696 A1 | 5/2006 | Bessho | |
| 2006/0132990 A1 | 6/2006 | Morise et al. | |
| 2006/0227465 A1 | 10/2006 | Inokuchi et al. | |
| 2007/0019337 A1 | 1/2007 | Apalkov et al. | |
| 2007/0047294 A1 | 3/2007 | Panchula | |
| 2007/0096229 A1 | 5/2007 | Yoshikawa et al. | |
| 2007/0215967 A1 | 9/2007 | Wu et al. | |
| 2007/0242501 A1 | 10/2007 | Hung et al. | |
| 2007/0297220 A1 | 12/2007 | Yoshikawa et al. | |
| 2008/0031035 A1 | 2/2008 | Rodmacq et al. | |
| 2008/0049488 A1 | 2/2008 | Rizzo | |
| 2008/0112094 A1 | 5/2008 | Kent et al. | |
| 2008/0151442 A1 | 6/2008 | Mauri et al. | |
| 2008/0151614 A1 | 6/2008 | Guo | |
| 2008/0164547 A1 | 7/2008 | Higo et al. | |
| 2008/0185670 A1 | 8/2008 | Kajiyama | |
| 2008/0259508 A2 | 10/2008 | Kent et al. | |
| 2008/0273274 A1 | 11/2008 | Kojima et al. | |
| 2008/0297292 A1 | 12/2008 | Viala et al. | |
| 2009/0015958 A1 | 1/2009 | Nakamura et al. | |
| 2009/0046501 A1 | 2/2009 | Ranjan et al. | |
| 2009/0072185 A1 | 3/2009 | Raksha et al. | |
| 2009/0091037 A1 | 4/2009 | Assefa et al. | |
| 2009/0098413 A1 | 4/2009 | Kanegae | |
| 2009/0161421 A1 | 6/2009 | Cho et al. | |
| 2009/0209050 A1 | 8/2009 | Wang et al. | |
| 2009/0209102 A1 | 8/2009 | Zhong et al. | |
| 2009/0231909 A1 | 9/2009 | Dieny et al. | |
| 2009/0244792 A1 | 10/2009 | Nakayama et al. | |
| 2009/0296462 A1 | 12/2009 | Kent et al. | |
| 2010/0019333 A1 | 1/2010 | Zhao et al. | |
| 2010/0124091 A1 | 5/2010 | Cowburn | |
| 2010/0193891 A1 | 8/2010 | Wang et al. | |
| 2010/0232206 A1 | 9/2010 | Li | |
| 2010/0246254 A1 | 9/2010 | Prejbeanu et al. | |
| 2010/0271870 A1 | 10/2010 | Zheng et al. | |
| 2010/0290275 A1 | 11/2010 | Park et al. | |
| 2010/0304204 A1 | 12/2010 | Routkevitch et al. | |
| 2011/0001108 A1 | 1/2011 | Greene et al. | |
| 2011/0032645 A1 | 2/2011 | Noel et al. | |
| 2011/0058412 A1 | 3/2011 | Zheng et al. | |
| 2011/0089511 A1 | 4/2011 | Keshtbod et al. | |
| 2011/0121417 A1 | 5/2011 | Li | |
| 2011/0133298 A1 | 6/2011 | Chen et al. | |
| 2011/0141804 A1 | 6/2011 | Apalkov et al. | |
| 2011/0149632 A1 | 6/2011 | Chen et al. | |
| 2011/0216436 A1 | 9/2011 | Igarashi | |
| 2011/0235217 A1 | 9/2011 | Chen et al. | |
| 2011/0241139 A1 | 10/2011 | Yet et al. | |
| 2011/0305077 A1 | 12/2011 | Higo et al. | |
| 2012/0012952 A1 | 1/2012 | Chen et al. | |
| 2012/0052258 A1 | 3/2012 | Op DeBeeck et al. | |
| 2012/0069649 A1 | 3/2012 | Ranjan et al. | |
| 2012/0120520 A1 | 5/2012 | Childress et al. | |
| 2012/0155156 A1 | 6/2012 | Watts | |
| 2012/0156390 A1 | 6/2012 | Araki | |
| 2012/0181642 A1 | 7/2012 | Prejbeanu et al. | |
| 2012/0188818 A1 | 7/2012 | Ranjan et al. | |
| 2012/0228728 A1 | 9/2012 | Ueki et al. | |
| 2012/0241827 A1 | 9/2012 | Daibou et al. | |
| 2012/0280336 A1 | 11/2012 | Jan | |
| 2012/0280339 A1 | 11/2012 | Zhang et al. | |
| 2012/0294078 A1 | 11/2012 | Kent et al. | |
| 2012/0299133 A1 | 11/2012 | Son et al. | |
| 2013/0001506 A1 | 1/2013 | Sato et al. | |
| 2013/0001652 A1 | 1/2013 | Yoshikawa et al. | |
| 2013/0021841 A1 | 1/2013 | Zhou et al. | |
| 2013/0062714 A1 | 3/2013 | Zhu | |
| 2013/0070522 A1* | 3/2013 | Saida | G11C 11/1675 365/173 |
| 2013/0070523 A1 | 3/2013 | Saida et al. | |
| 2013/0075845 A1 | 3/2013 | Chen et al. | |
| 2013/0077391 A1 | 3/2013 | Luo et al. | |
| 2013/0119495 A1 | 5/2013 | Vetro et al. | |
| 2013/0157385 A1 | 6/2013 | Jung et al. | |
| 2013/0163316 A1 | 6/2013 | Higo et al. | |
| 2013/0181305 A1 | 7/2013 | Nakayama et al. | |
| 2013/0244344 A1 | 9/2013 | Malmhall et al. | |
| 2013/0267042 A1 | 10/2013 | Satoh et al. | |
| 2013/0270523 A1 | 10/2013 | Wang et al. | |
| 2013/0270661 A1 | 10/2013 | Yi et al. | |
| 2013/0307097 A1 | 11/2013 | Yi et al. | |
| 2013/0341801 A1 | 12/2013 | Satoh et al. | |
| 2014/0009994 A1 | 1/2014 | Parkin et al. | |
| 2014/0036573 A1 | 2/2014 | Ishihara et al. | |
| 2014/0042571 A1 | 2/2014 | Gan et al. | |
| 2014/0048896 A1 | 2/2014 | Huang et al. | |
| 2014/0070341 A1 | 3/2014 | Beach et al. | |
| 2014/0087483 A1 | 3/2014 | Ohsawa | |
| 2014/0093701 A1 | 4/2014 | Sahoo et al. | |
| 2014/0103472 A1 | 4/2014 | Kent et al. | |
| 2014/0103473 A1 | 4/2014 | Kent et al. | |
| 2014/0131824 A1 | 5/2014 | Kitagawa et al. | |
| 2014/0159175 A1* | 6/2014 | Lee | H01L 43/10 257/421 |
| 2014/0169085 A1 | 6/2014 | Wang et al. | |
| 2014/0177316 A1 | 6/2014 | Otsuka et al. | |
| 2014/0217531 A1 | 8/2014 | Jan | |
| 2014/0252439 A1 | 9/2014 | Guo | |
| 2014/0252519 A1 | 9/2014 | Kim | |
| 2014/0264671 A1 | 9/2014 | Chepulskyy et al. | |
| 2015/0008550 A1 | 1/2015 | Min et al. | |
| 2015/0056368 A1 | 2/2015 | Wang et al. | |
| 2015/0102438 A1 | 4/2015 | Gan et al. | |
| 2015/0162525 A1 | 6/2015 | Park et al. | |
| 2015/0171315 A1* | 6/2015 | Gan | H01L 29/66984 257/421 |
| 2015/0171316 A1 | 6/2015 | Park et al. | |
| 2015/0279904 A1 | 10/2015 | Pinarbasi | |
| 2015/0287910 A1 | 10/2015 | Lu | |
| 2015/0357015 A1 | 12/2015 | Kent et al. | |
| 2015/0372687 A1 | 12/2015 | Buhrman et al. | |
| 2016/0027999 A1 | 1/2016 | Pinarbasi et al. | |
| 2016/0087193 A1 | 3/2016 | Pinarbasi et al. | |
| 2016/0093798 A1 | 3/2016 | Kim et al. | |
| 2016/0099405 A1 | 4/2016 | Zimmer et al. | |
| 2016/0111634 A1 | 4/2016 | Lee et al. | |
| 2016/0126452 A1 | 5/2016 | Kuo et al. | |

(56) References Cited

U.S. PATENT DOCUMENTS

| | | | |
|---|---|---|---|
| 2016/0126453 A1 | 5/2016 | Chen et al. | |
| 2016/0163965 A1 | 6/2016 | Han et al. | |
| 2016/0163973 A1 | 6/2016 | Pinarbasi | |
| 2016/0181508 A1 | 6/2016 | Lee et al. | |
| 2016/0218278 A1 | 7/2016 | Pinarbasi et al. | |
| 2016/0276006 A1 | 9/2016 | Ralph et al. | |
| 2016/0284762 A1 | 9/2016 | Wang et al. | |
| 2016/0315118 A1 | 10/2016 | Kardasz et al. | |
| 2016/0315259 A1 | 10/2016 | Kardasz et al. | |
| 2016/0372656 A1 | 12/2016 | Pinarbasi et al. | |
| 2017/0018705 A1 | 1/2017 | Harms et al. | |
| 2017/0025472 A1 | 1/2017 | Kim et al. | |
| 2017/0033156 A1 | 2/2017 | Gan et al. | |
| 2017/0033283 A1 | 2/2017 | Pinarbasi et al. | |
| 2017/0033742 A1 | 2/2017 | Akerman | |
| 2017/0047107 A1 | 2/2017 | Berger et al. | |
| 2017/0084826 A1 | 3/2017 | Zhou et al. | |
| 2017/0200487 A1* | 7/2017 | Kim | H01L 43/08 |
| 2017/0222132 A1 | 8/2017 | Pinarbasi et al. | |
| 2017/0236570 A1 | 8/2017 | Kent et al. | |
| 2017/0324029 A1 | 11/2017 | Pinarbasi et al. | |
| 2017/0331032 A1 | 11/2017 | Chen et al. | |
| 2017/0331033 A1 | 11/2017 | Kardasz et al. | |
| 2017/0346002 A1 | 11/2017 | Pinarbasi et al. | |
| 2018/0047894 A1 | 2/2018 | Pinarbasi et al. | |
| 2018/0076382 A1 | 3/2018 | Park et al. | |
| 2018/0114898 A1 | 4/2018 | Lee | |
| 2018/0205001 A1 | 7/2018 | Beach et al. | |
| 2018/0248110 A1 | 8/2018 | Kardasz et al. | |
| 2018/0248113 A1 | 8/2018 | Pinarbasi et al. | |
| 2019/0304653 A1 | 10/2019 | Oguz et al. | |
| 2020/0220074 A1 | 7/2020 | Kardasz et al. | |

FOREIGN PATENT DOCUMENTS

| | | |
|---|---|---|
| CN | 101093721 A | 12/2007 |
| CN | 101036195 A | 9/2008 |
| CN | 101425477 A | 5/2009 |
| CN | 101546808 A | 9/2009 |
| CN | 102334207 A | 1/2012 |
| CN | 102959693 A | 3/2013 |
| CN | 105706259 A | 6/2016 |
| CN | 105917480 A | 8/2016 |
| CN | 106062979 A | 10/2016 |
| CN | 107750382 A | 3/2018 |
| CN | 107851712 A | 3/2018 |
| EP | 1345277 A1 | 9/2003 |
| EP | 3298636 A1 | 3/2018 |
| FR | 2817998 A1 | 6/2002 |
| FR | 2832542 A1 | 5/2003 |
| FR | 2910716 A1 | 6/2008 |
| JP | H10-4012 A | 1/1998 |
| JP | H11-120758 A | 4/1999 |
| JP | H11-352867 A | 12/1999 |
| JP | 2001-006932 A | 1/2001 |
| JP | 2001-195878 A | 7/2001 |
| JP | 2002-261352 A | 9/2002 |
| JP | 2002-357489 A | 12/2002 |
| JP | 2003-318461 A | 11/2003 |
| JP | 2005-044848 | 2/2005 |
| JP | 2005-150482 A | 6/2005 |
| JP | 2005-535111 A | 11/2005 |
| JP | 4066477 B2 | 3/2006 |
| JP | 2006-128579 A | 5/2006 |
| JP | 2008-38362 | 2/2008 |
| JP | 2008-098365 | 4/2008 |
| JP | 2008-524830 A | 7/2008 |
| JP | 2008-192832 | 8/2008 |
| JP | 2009-027177 A | 2/2009 |
| JP | 2009-231753 | 10/2009 |
| JP | 2012-004222 | 1/2012 |
| JP | 2013-012546 A | 1/2013 |
| JP | 2013-048210 | 3/2013 |
| JP | 2013-219010 A | 10/2013 |
| JP | 2014-007263 | 1/2014 |
| JP | 2014-022751 | 2/2014 |
| JP | 2014-039061 A | 2/2014 |
| JP | 2014-517516 | 7/2014 |
| JP | 2014-530503 | 11/2014 |
| JP | 5635666 B2 | 12/2014 |
| JP | 2015-002352 A | 1/2015 |
| JP | 2017-510989 A | 4/2017 |
| JP | 2017-527097 A | 9/2017 |
| JP | 2017-532752 A | 11/2017 |
| KR | 10-2014-0115246 A | 9/2014 |
| KR | 10-2015-0016162 A | 2/2015 |
| WO | WO-2009-080636 A1 | 7/2009 |
| WO | WO-2011-005484 A2 | 1/2011 |
| WO | WO 2013/027406 | 2/2013 |
| WO | WO-2014-062681 A1 | 4/2014 |
| WO | WO 2015/094561 | 6/2015 |
| WO | WO-2015-153142 A1 | 10/2015 |
| WO | WO-2016-011435 A1 | 1/2016 |
| WO | WO-2016-014326 A1 | 1/2016 |
| WO | WO-2016-048603 A1 | 3/2016 |
| WO | WO-2016-171800 A1 | 10/2016 |
| WO | WO-2016-171920 A1 | 10/2016 |
| WO | WO-2016-204835 A1 | 12/2016 |
| WO | WO-2017-019134 A1 | 2/2017 |
| WO | WO-2017-030647 A1 | 2/2017 |
| WO | WO-2017-131894 A1 | 8/2017 |
| WO | WO 2017/151735 A1 | 9/2017 |

OTHER PUBLICATIONS

Supplementary European Search Report dated Nov. 12, 2020 in EP Application No. 18761708.9.
Berger et al.', U.S. Appl. No. 15/174,482, filed Jun. 6, 2016, entitled "Method and Apparatus for Bipolar Memory Write-Verify".
Bozdag et al.; U.S. Appl. No. 15/859,047, filed Dec. 29, 2017, entitled "Three-Terminal MRAM with AC Write-Assist for Low Read Disturb".
El Baraji et al.; U.S. Appl. No. 15/859,514, filed Dec. 30, 2017, entitled "Microwave Write-Assist in Orthogonal STT-MRAM".
El Baraji et al.; U.S. Appl. No. 15/859,517, filed Dec. 30, 2017, entitled "Microwave Write-Assist in Series-Interconnected Orthogonal STT-MRAM Devices".
Extended European Search Report dated Jan. 30, 2019 in EU Application No. 16812075.6.
Final Office Action dated Jul. 9, 2015 in U.S. Appl. No. 14/242,419; 19 pages.
Final Office Action dated Jun. 9, 2017 in U.S. Appl. No. 14/814,038; 19 pages.
Final Office Action dated Nov. 8, 2018 in U.S. Appl. No. 15/445,260.
Final Office Action dated Aug. 2, 2018 in U.S. Appl. No. 15/674,620.
Final Office Action dated Nov. 16, 2018 in U.S. Appl. No. 15/445,362.
Final Office Action dated Dec. 13, 2018 in U.S. Appl. No. 15/091,853.
Final Office Action dated Jan. 27, 2020 in U.S. Appl. No. 15/674,620.
Gajek et al.; U.S. Appl. No. 15/858,988, filed Dec. 29, 2017, entitled "Self-Generating AC Current Assist in Orthogonal STT MRAM".
Ikeda et al.; "A perpendicular-anisotropy CoFeB—MgO magnetic tunnel junction"; Nature Materials, vol. 9, Sep. 2010; pp. 721-724 (4 pages).
International Search Report and Written Opinion dated Jul. 10, 2015 in PCT/US2015/021580; 12 pages.
International Search Report and Written Opinion dated Oct. 30, 2015 in PCT/US2015/040700; 11 pages.
International Search Report and Written Opinion dated Dec. 14, 2015 in PCT/US2015/047875; 13 pages.
International Search Report and Written Opinion dated Jun. 17, 2016 in PCT/US2016/021324; 9 pages.
International Search Report and Written Opinion dated Jun. 17, 2016 in PCT/US2016/021691; 9 pages.
International Search Report and Written Opinion dated Jul. 15, 2016 in PCT/US2016/026473; 9 pages.
International Search Report and Written Opinion dated Jul. 21, 2016 in PCT/US2016/027445; 10pages.
International Search Report and Written Opinion dated Sep. 26, 2016 in PCT/US2016/037843; 10 pages.

(56) References Cited

OTHER PUBLICATIONS

International Search Report and Written Opinion dated Apr. 7, 2017 in PCT/US2016/067444; 13 pages.
International Search Report and Written Opinion dated May 10, 2018 in PCT/US2018/014645; 14 pages.
International Search Report and Written Opinion dated May 30, 2018 in PCT/US2018/014641; 13 pages.
Kardasz et al.; U.S. Appl. No. 14/866,359, filed Sep. 25, 2015 entitled "Spin Transfer Torque Structure for MRAM Devices Having a Spin Current Injection Capping Layer".
Kardasz et al.; U.S. Appl. No. 15/091,853, filed Apr. 6, 2016, entitled "High Annealing Temperature Perpendicular Magnetic Anisotropy Structure for Magnetic Random Access Memory".
Kardasz et al.; U.S. Appl. No. 15/657,498, filed Jul. 24, 2017, entitled "Spin Transfer Torque Structure for MRAM Devices Having a Spin Current Injection Capping Layer".
Kent et al.; U.S. Appl. No. 61/715,111, filed Oct. 17, 2012, entitled "Inverted Orthogonal Spin Transfer Layer Stack".
Koch et al., "Thermally Assisted Magnetization Reversal in Submicron-Sized Magnetic Thin Films"; Physical Review Letters; The American Physical Society; vol. 84, No. 23; Jun. 5, 2000, pp. 5419-5422 (4 pages).
Lee et al., "Analytical investigation of spin-transfer dynamics using a perpendicular-to-plane polarizer"; Applied Physics Letters; American Institute of Physics; vol. 86, (2005); pp. 022505-1 to 022505-3 (3 pages).
"Magnetic Technology Sprintronics, Media and Interface"; Data Storage Institute, R&D Highlights; Sep. 2010; 3 pages.
Martens et al., "Thermally Induced Magnetic Switching in Thin Ferromagnetic Annuli"; NSF grants PHY-0351964 (DLS); 2005; 11 pages.
Martens et al., "Magnetic Reversal in Nanoscopic Ferromagnetic Rings"; NSF grants PHY-0351964 (DLS); 2006; 23 pages.
NonFinal Office Action dated Mar. 20, 2015 in U.S. Appl. No. 14/242,419; 18 pages.
NonFinal Office Action dated Sep. 11, 2015 in U.S. Appl. No. 14/492,943; 13 pages.
NonFinal Office Action dated Jan. 20, 2016 in U.S. Appl. No. 14/242,419; 17 pages.
NonFinal Office Action dated Dec. 9, 2017 in U.S. Appl. No. 14/866,359; 26 pages.
NonFinal Office Action dated Dec. 23, 2016 in U.S. Appl. No. 15/093,367; 13 pages.
NonFinal Office Action dated Jan. 25, 2017 in U.S. Appl. No. 15/097,576; 17 pages.
NonFinal Office Action dated Feb. 6, 2017 in U.S. Appl. No. 14/814,036; 22 pages.
NonFinal Office Action dated Jun. 29, 2018 in U.S. Appl. No. 15/859,381.
Nonfinal Office Action dated Jun. 26, 2018 in U.S. Appl. No. 15/859,384.
NonFinal Office Action dated Jun. 29, 2018 in U.S. Appl. No. 15/859,374.
NonFinal Office Action dated Nov. 23, 2018 in U.S. Appl. No. 15/859,384.
NonFinal Office Action dated Nov. 26, 2018 in U.S. Appl. No. 15/858,950.
NonFinal Office Action dated Jan. 15, 2019 in U.S. Appl. No. 15/862,788.
NonFinal Office Action dated Mar. 22, 2019 in U.S. Appl. No. 16/027,739.
NonFinal Office Action dated Jun. 25, 2019 in U.S. Appl. No. 16/197,622.
NonFinal Office Action dated Aug. 15, 2019 in U.S. Appl. No. 15/674,620.
NonFinal Office Action dated Sep. 4, 2019 in U.S. Appl. No. 15/445,260.
NonFinal Office Action dated Sep. 16, 2019 in U.S. Appl. No. 15/445,362.
Notice of Allowance dated Apr. 21, 2017 in U.S. Appl. No. 15/157,783; 36 pages.
Notice of Allowance dated Jul. 27, 2017 in U.S. Appl. No. 15/097,576; 22 pages.
Notice of Allowance dated Oct. 16, 2017 in U.S. Appl. No. 14/814,036; 16 pages.
Notice of Allowance dated Sep. 26, 2018 in U.S. Appl. No. 15/859,047; 10 pages.
Notice of Allowance dated Oct. 24, 2018 in U.S. Appl. No. 15/859,517.
Notice of Allowance dated Nov. 9, 2018 in U.S. Appl. No. 15/859,015.
Notice of Allowance dated Nov. 21, 2018 in U.S. Appl. No. 15/859,030.
Notice of Allowance dated Nov. 21, 2018 in U.S. Appl. No. 15/859,374.
Notice of Allowance dated Nov. 30, 2018 in U.S. Appl. No. 15/859,514.
Notice of Allowance dated Dec. 12, 2018 in U.S. Appl. No. 15/858,988.
Notice of Allowance dated Feb. 12, 2019 in U.S. Appl. No. 15/859,381.
Notice of Allowance dated Mar. 21, 2019 in U.S. Appl. No. 15/858,950.
Notice of Allowance dated Jun. 26, 2019 in U.S. Appl. No. 15/091,853.
Notice of Allowance dated Oct. 2, 2019 in U.S. Appl. No. 16/123,663.
Notice of Allowance dated Oct. 4, 2019 in U.S. Appl. No. 16/027,739.
Notice of Allowance dated Nov. 15, 2019 in U.S. Appl. No. 16/192,972.
Notice of Allowance dated Dec. 11, 2019 in U.S. Appl. No. 16/197,622.
Notice of Allowance dated Jan. 17, 2020 in U.S. Appl. No. 15/445,362.
Notice of Allowance date Jan. 28, 2020 in U.S. Appl. No. 15/445,260.
Office Action dated Aug. 30, 2018 in Chinese Patent Application No. 201580009984.2.
Office Action dated Oct. 9, 2018 in Japanese Patent Application No. 2016-526761.
Office Action dated Jul. 23, 2019 in Japanese Patent Application No. 2016-529428 (with English translation).
Pinarbasi et al.; U.S. Appl. No. 14/341,185, filed Jul. 25, 2014, entitled "Method for Manufacturing MTJ Memory Device".
Pinarbasi et al.; U.S. Appl. No. 14/492,943, filed Sep. 22, 2014, entitled "Magnetic Tunnel Junction Structure for MRAM Device".
Pinarbasi et al.; U.S. Appl. No. 14/814,036, filed Jul. 30, 2015, entitled "Precessional Spin Current Structure for MRAM".
Pinarbasi et al.; U.S. Appl. No. 15/041,325, filed Feb. 11, 2016, entitled "Method for Manufacturing MTJ Memory Device".
Pinarbasi et al.; U.S. Appl. No. 15/093,367, filed Apr. 7, 2016, entitled "Magnetic Tunnel Junction Structure for MRAM Device".
Pinarbasi et al.; U.S. Appl. No. 15/097,576, filed Apr. 13, 2016, entitled "Polishing Stop Layer(s) for Processing Arrays of Semiconductor Elements".
Pinarbasi et al.; U.S. Appl. No. 15/157,783, filed May 18, 2016, entitled "Memory Cell Having Magnetic Tunnel Junction and Thermal Stability Enhancement Layer".
Pinarbasi et al.; U.S. Appl. No. 15/445,260, filed Feb. 28, 2017, entitled "Precessional Spin Current Structure for MRAM".
Pinarbasi et al.; U.S. Appl. No. 15/445,362, filed Feb. 28, 2017, entitled "Precessional Spin Current Structure for MRAM".
Pinarbasi et al.; U.S. Appl. No. 15/656,398, filed Jul. 21, 2017, entitled "Memory Cell Having Magnetic Tunnel Junction and Thermal Stability Enhancement Layer".
Pinarbasi et al.; U.S. Appl. No. 15/674,620, filed Aug. 11, 2017, entitled "Polishing Stop Layer(s) for Processing Arrays of Semiconductor Elements".
Pinarbasi et al.; U.S. Appl. No. 15/794,871, filed Oct. 26, 2017, entitled "Precessional Spin Current Structure for MRAM".
Restriction Requirement in U.S. Appl. No. 16/123,663 dated Apr. 24, 2019.
Ryan et al.; U.S. Appl. No. 15/859,015, filed Dec. 29, 2017, entitled "Shared Oscillator (STNO) for MRAM Array Write-Assist in Orthogonal STT-MRAM".

(56) References Cited

OTHER PUBLICATIONS

Schabes et al.; U.S. Appl. No. 15/634,629, filed Jun. 27, 2017, entitled "MRAM with Reduced Stray Magnetic Fields".

Schabes et al.; U.S. Appl. No. 15/859,384, filed Dec. 30, 2017, entitled "Perpendicular Magnetic Tunnel Junction Device with Skyrmionic Assist Layers for Free Layer Switching".

Schabes et al.; U.S. Appl. No. 15/859,381, filed Dec. 30, 2017, entitled "Perpendicular Magnetic Tunnel Junction Device with Precessional Spin Current Layer Having a Modulated Moment Density".

Schabes et al.; U.S. Appl. No. 15/859,379, filed Dec. 30, 2017, entitled "Perpendicular Magnetic Tunnel Junction Device with Offset Precessional Spin Current Layer".

Schabes et al.; U.S. Appl. No. 15/859,374, filed Dec. 30, 2017, entitled "Switching and Stability Control for Perpendicular Magnetic Tunnel Junction Device".

Schabes et al.; U.S. Appl. No. 15/862,788, filed Jan. 5, 2018, entitled "Perpendicular Magnetic Tunnel Junction Device with Skyrmionic Enhancement Layers for the Precessional Spin Current Magnetic Layer".

Seo et al.; "Current-induced synchronized switching of magnetization;" Applied Physics Letters 101; 2012 American Institute of Physics; Aug. 7, 2012; 6 pages.

Tzoufras et al.; U.S. Appl. No. 15/858,950, filed Dec. 29, 2017, entitled "AC Current Pre-Charge Write-Assist in Orthogonal STT-MRAM".

Tzoufras et al.; U.S. Appl. No. 15/859,030, filed Dec. 29, 2017, entitled "AC Current Write-Assist in Orthogonal STT-MRAM".

Notice of Allowance dated Jan. 28, 2020 in U.S. Appl. No. 15/445,260.

Office Action dated Jan. 21, 2020 in Japanese Patent Application No. 2016-529428 (with English translation).

Office Action dated Mar. 10, 2020 in Japanese Patent Application No. 2017-564822 (with English translation).

JP Patent App. No. 2019-546792, Office Action dated Oct. 5, 2021, with English translation, 5 pages.

\* cited by examiner

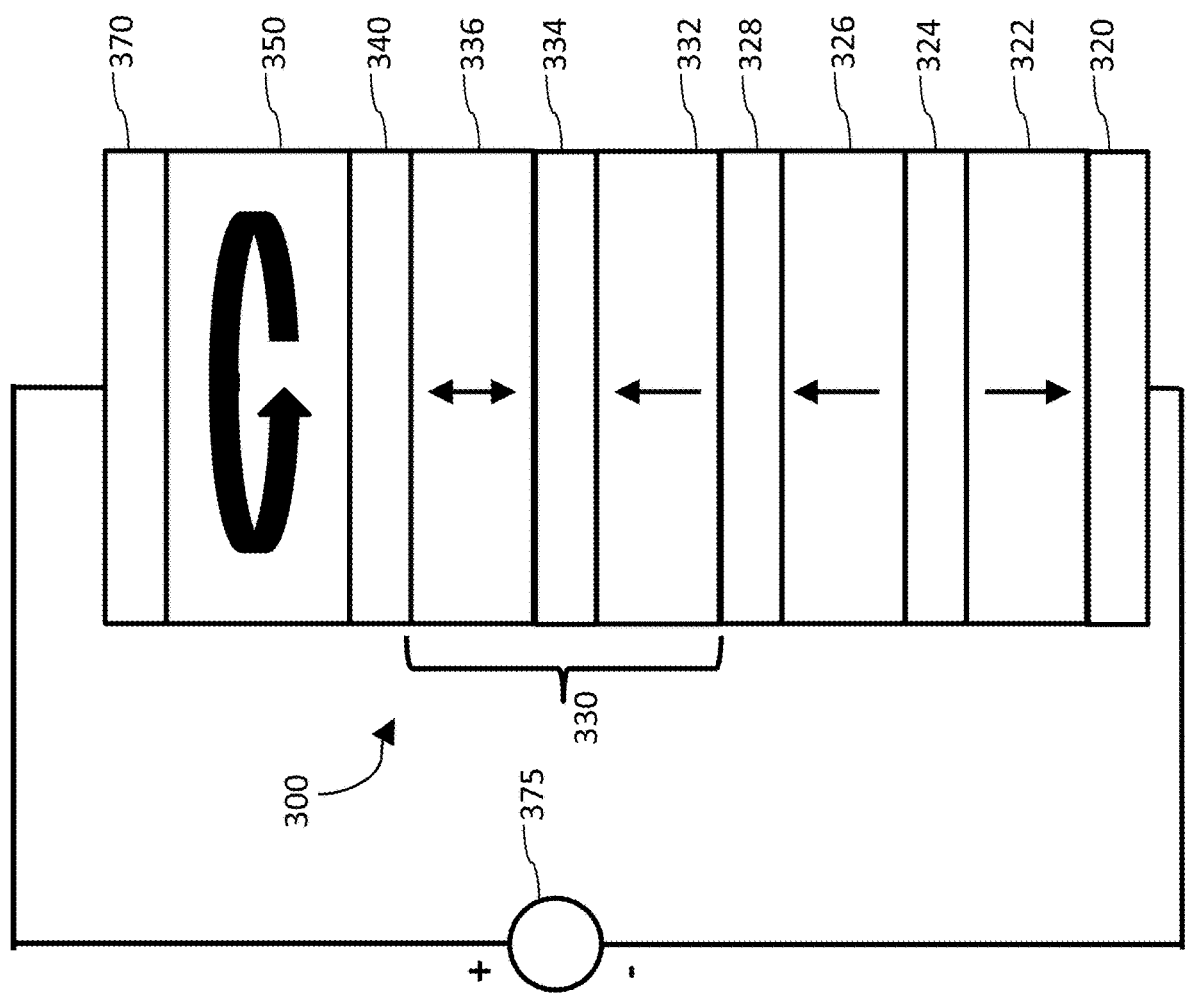

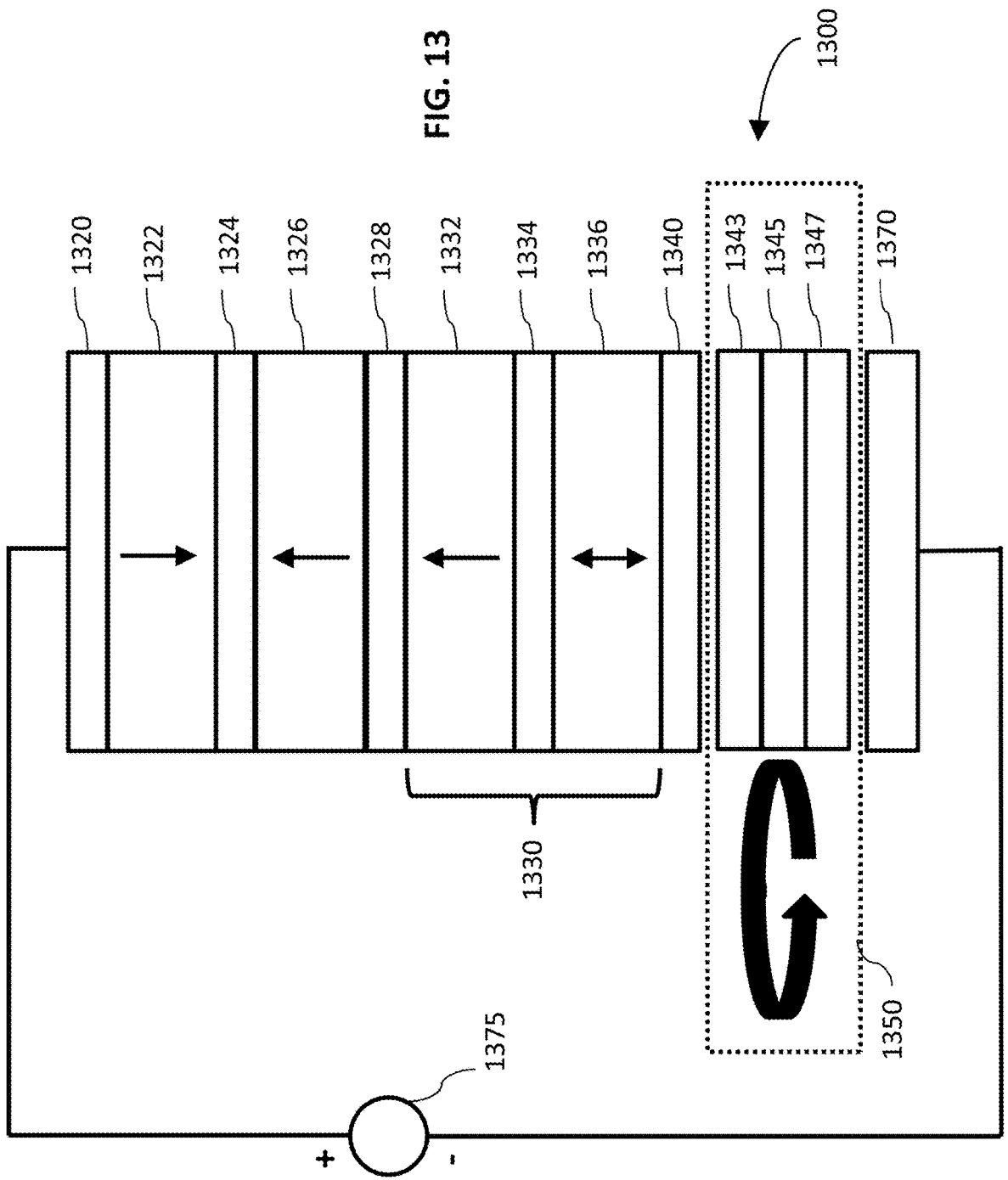

PRECESSIONAL SPIN CURRENT STRUCTURE FOR MRAM

FIELD

The present patent document relates generally to spin-transfer torque magnetic random access memory and, more particularly, to a magnetic tunnel junction stack having improved performance of the free layer in the magnetic tunnel junction structure through use of a precessional spin current structure having high in-plan anisotropy through the use of materials having face centered cubic materials.

BACKGROUND

Magnetoresistive random-access memory ("MRAM") is a non-volatile memory technology that stores data through magnetic storage elements. These elements are two ferromagnetic plates or electrodes that can hold magnetization and are separated by a non-magnetic material, such as a non-magnetic metal or insulator. In general, one of the plates has its magnetization pinned (i.e., a "reference layer"), meaning that this layer has a higher coercivity than the other layer and requires a larger magnetic field or spin-polarized current to change the orientation of its magnetization. The second plate is typically referred to as the free layer and its magnetization direction can be changed by a smaller magnetic field or spin-polarized current relative to the reference layer.

MRAM devices store information by changing the orientation of the magnetization of the free layer. In particular, based on whether the free layer is in a parallel or anti-parallel alignment relative to the reference layer, either a "1" or a "0" can be stored in each MRAM cell. Due to the spin-polarized electron tunneling effect, the electrical resistance of the cell change due to the orientation of the magnetization of the two layers. The cell's resistance will be different for the parallel and anti-parallel states and thus the cell's resistance can be used to distinguish between a "1" and a "0". One important feature of MRAM devices is that they are non-volatile memory devices, since they maintain the information even when the power is off. The two plates can be sub-micron in lateral size and the magnetization direction can still be stable with respect to thermal fluctuations.

Spin transfer torque or spin transfer switching, uses spin-aligned ("polarized") electrons to change the magnetization orientation of the free layer in the magnetic tunnel junction. In general, electrons possess a spin, a quantized number of angular momentum intrinsic to the electron. An electrical current is generally unpolarized, i.e., it consists of 50% spin up and 50% spin down electrons. Passing a current though a magnetic layer polarizes electrons with the spin orientation corresponding to the magnetization direction of the magnetic layer (i.e., polarizer), thus produces a spin-polarized current. If a spin-polarized current is passed to the magnetic region of a free layer in the magnetic tunnel junction device, the electrons will transfer a portion of their spin-angular momentum to the magnetization layer to produce a torque on the magnetization of the free layer. Thus, this spin transfer torque can switch the magnetization of the free layer, which, in effect, writes either a "1" or a "0" based on whether the free layer is in the parallel or anti-parallel states relative to the reference layer.

FIG. 1 illustrates a magnetic tunnel junction ("MTJ") stack 100 for a conventional MRAM device. As shown, stack 100 includes one or more seed layers 110 provided at the bottom of stack 100 to initiate a desired crystalline growth in the above-deposited layers. Furthermore, MTJ 130 is deposited on top of SAF layer 120. MTJ 130 includes reference layer 132, which is a magnetic layer, a non-magnetic tunneling barrier layer (i.e., the insulator) 134, and the free layer 136, which is also a magnetic layer. It should be understood that reference layer 132 is actually part of SAF layer 120, but forms one of the ferromagnetic plates of MTJ 130 when the non-magnetic tunneling barrier layer 134 and free layer 136 are formed on reference layer 132. As shown in FIG. 1, magnetic reference layer 132 has a magnetization direction perpendicular to its plane. As also seen in FIG. 1, free layer 136 also has a magnetization direction perpendicular to its plane, but its direction can vary by 180 degrees.

The first magnetic layer 114 in the SAF layer 120 is disposed over seed layer 110. SAF layer 120 also has a antiferromagnetic coupling layer 116 disposed over the first magnetic layer 114. Furthermore, a nonmagnetic spacer 140 is disposed on top of MTJ 130 and a polarizer 150 is disposed on top of the nonmagnetic spacer 140. Polarizer 150 is a magnetic layer that has a magnetic direction in its plane, but is perpendicular to the magnetic direction of the reference layer 132 and free layer 136. Polarizer 150 is provided to polarize a current of electrons ("spin-aligned electrons") applied to MTJ structure 100. Further, one or more capping layers 160 can be provided on top of polarizer 150 to protect the layers below on MTJ stack 100. Finally, a hard mask 170 is deposited over capping layers 160 and is provided to pattern the underlying layers of the MTJ structure 100, using a reactive ion etch (RIE) process.

Various mechanisms have been proposed to assist the free-layer magnetization switching in magnetic tunnel junction (MTJ) devices such as orthogonal spin transfer for in plane magnetic tunnel junction devices. One issue has been that to realize the orthogonal spin transfer effect for in-plane MTJ structures, large spin currents may be required for switching. The need for large switching currents may limit such device's commercial applicability. One way proposed to reduce switching current is to lower the magnetization of the free layer. However, if the effective magnetization of the free layer is lowered significantly, the orthogonal effect has to be limited so that the free-layer does not go into precessional mode that would make the end state of the free-layer magnetization un-deterministic. This defines the operation window for the in-plane OST structures. In an in-plane device, unlike that shown in FIG. 1, the magnetization direction of the reference layer and free layer are in the plane of the layer. Another aspect of in-plane devices is that the thermal stability requirements may limit the size of the MTJ devices to approximately sixty nanometers or higher.

For perpendicular MTJ structures such as those shown in FIG. 1, the precession is not an issue. The orthogonal polarizer acts on the free layer magnetization at the initial state, but when the precession takes hold, the fixed orthogonal polarizer 150 helps only half the cycle of the free-layer magnetization rotation while it harms the other half of the cycle. This is demonstrated with reference to FIGS. 2A-2B and 3. FIGS. 2A-2B show switching of a free layer 136 of an MTJ. As is seen, free layer 136 has a magnetization direction 200 perpendicular to that of the polarizer 150. The magnetization direction 200 of the free layer 136 can rotate by 180 degrees. FIGS. 2A-2B show precession about the axis of the magnetization vector of free layer 136. During precession, magnetic vector 200 begins to rotate about its axis in a cone-like manner such that its magnetization vector 200' deflects from the perpendicular axis 202 of free layer 136. For an ideal case, prior to initiating precession, no component of magnetic vector 200 is in the plane of free layer 136, once precession starts, a component of magnetic vector 200' can be found both in-plane and orthogonal to free layer 136. As magnetic vector 200' continues to precess (i.e., switch), the rotation of vector 200' extends further from the center of free layer 136, as is seen in FIG. 2B.

In prior MTJ devices using a polarizer such as polarizer 150, the magnetization direction of polarizer 150 is fixed, which is shown in FIGS. 1 and 3. See also U.S. Pat. No. 6,532,164, which states that the direction of the magnetization of the polarizing layer cannot vary in the presence of current. Prior to current passing through the MTJ, the free layer 136 has a magnetization direction 200 substantially perpendicular to that of the polarizer 150. While the magnetization direction 200 of the free layer 136 can rotate by 180 degrees, such rotation is normally precluded by the free layer's inherent damping ability 205, which is represented by a vector 205 pointing to axis 202 (shown as a dashed line in FIG. 2A as well as FIG. 3). Axis 202 is perpendicular to the plane of free layer 136. This damping 205 has value, defined by the damping constant, which maintains the magnetization direction of the free layer 136.

Passing a current through polarizer 150 produces a spin-polarized current, which creates a spin transfer torque 210 in the direction of the polarizer 150 on the magnetization vector 200. This spin transfer torque from the polarizer adds to the main spin transfer torque that causes free layer magnetization direction switching. In devices like those shown in FIG. 1, when the spin transfer torque 210 begins to help overcome the damping 205 inherent to the free layer 136, the magnetic direction 200' begins to precess about its axis, as shown in FIG. 2A. As seen in FIG. 3, spin transfer torque 210 helps the magnetization direction of the free layer 136 to precess in a cone-like manner around an axis 202 perpendicular to the plane of the layers. When a spin polarized current traverses the stack 100, the magnetization of the free layer 136 precesses in a continuous manner (i.e. it turns on itself in a continuous manner as shown in FIG. 3) with maintained oscillations until the magnetic direction of free layer 136 is opposite the magnetic direction prior to the spin torque causing precession, i.e., the magnetic direction of free layer 136 switches by 180 degrees.

FIG. 3 illustrates precession of a free layer 136 of an MTJ assisted by spin polarized current provided by polarizing magnetic layer 150. The spin polarized electrons from polarizer 150 provide torque 210 that helps overcome the damping 205 in the first half of the precession 215 because the torque 210 provided by the spin polarized current is opposite that of the inherent damping 205 of the free layer 136. This is shown on the right-hand side of the middle portion of FIG. 3. However, the spin polarized electrons from polarizer 150 actually harm the switching process during the second half of the precession 220. The reason for this is that the spin of the electrons in the spin polarized current only apply a torque 210 in the direction of their polarization. Thus, when the magnetic vector is in the half of the precession cycle 220 that is opposite the spin of the polarized electrons, the spin transfer torque 210 actually works with the inherent damping 205 of free layer 136 to make rotation more difficult. This is shown in the left-hand side of the middle portion of FIG. 3. Indeed, it is the magnetization vector of the reference layer 132 (not shown in FIG. 3) that overcomes the damping of free layer 136 as well as the spin transfer torque 210 during the half of a precession cycle where the spin of the electrons harms precession, and thus it is the reference layer 132 that allows for completion of precession.

In these prior devices, because magnetization direction of polarizer 150 is fixed, once the precession holds, it has no positive effect on the switching mechanism for a full one-hundred eighty degree precession. This is because polarized electrons will help the spin transfer torque the most when all vectors are closely aligned.

In U.S. patent application Ser. No. 14/814,036, filed by the same Applicant as the present patent document, discloses an MRAM device having a precessional spin current magnetic layer that is physically separated from the free magnetic layer of a magnetic tunnel junction and which is coupled to the free magnetic layer by a non-magnetic spacer. In the device described in this co-pending application, the magnetization direction of the precessional spin current magnetic layer follows precession of the magnetization direction of the free magnetic layer, thereby causing spin transfer torque to assist switching of the magnetization vector of the free magnetic layer. The disclosure of U.S. patent application Ser. No. 14/814,036 is incorporated by reference in its entirety.

When using an in-plane precessional spin current magnetic layer with a perpendicular magnetic tunnel junction, it is desirable to maintain the magnetic moment of the precessional spin current magnetic layer in-plane while also reducing its magnetic moment. Unfortunately, many ferromagnetic materials such as CoFeB have interface perpendicular magneto crystalline anisotropy ("IPMA"), thus resulting in a magnetic direction that is out of plane. To avoid IPMA, the thickness of the CoFeB must be increased, generally to thickness greater than 1.5 nm. However, a 1.5 nm thick layer of CoFeB layer increases the magnetic moment such that it is equal to or greater than the magnetic moment of the free layer, hence losing the ability to set the in-plane magnetization for low magnetic moment of the precessional spin current magnetic layer independently. This is undesirable because the precessional spin current magnetic layer should remain in plane, and, as discussed, performance may be enhanced with the magnetic moment of the precessional spin current magnetic layer is reduced. This results in strong dipolar fields in the vicinity of the free layer of the magnetic tunnel junction, which decreases free layer stability.

SUMMARY

An MRAM device is disclosed that has a magnetic tunnel junction stack having a significantly improved performance of the free layer in the magnetic tunnel junction structure that requires significantly lower switching currents and which significantly reduces switching times for MRAM applications.

In an embodiment, a magnetic device includes a first synthetic antiferromagnetic structure in a first plane. The synthetic antiferromagnetic structure includes a magnetic reference layer, where the magnetic reference layer has a magnetization vector that is perpendicular to the first plane and has a fixed magnetization direction. An embodiment also includes a non-magnetic tunnel barrier layer in a second plane and disposed over the magnetic reference layer. An embodiment further includes a free magnetic layer in a third plane and disposed over the non-magnetic tunnel barrier layer. The free magnetic layer has a magnetization vector that is perpendicular to the third plane and has a magnetization direction that can precess from a first magnetization direction to a second magnetization direction. The magnetic reference layer, the non-magnetic tunnel barrier layer and the free magnetic layer form a magnetic tunnel junction. The embodiment further includes a non-magnetic spacer in a fourth plane that is disposed over the free magnetic layer. The magnetic coupling layer comprises MgO. In an embodiment, a precessional spin current magnetic layer is present in a fifth plane that is physically separated from the free magnetic layer and coupled to the free magnetic layer by the non-magnetic spacer. The precessional spin current magnetic layer has a magnetization vector with a magnetization component in the fifth plane which can freely rotate in any magnetic direction. The precessional spin current magnetic layer comprising a material has a face centered cubic (fcc) crystal structure. An embodiment further includes a capping layer in a sixth plane that is disposed over the precessional spin current magnetic layer. Electrical current is directed through the capping layer, the precessional spin current magnetic layer, the non-magnetic spacer, the free magnetic layer, the non-magnetic tunnel barrier layer, and the magnetic reference layer, wherein electrons of the electrical current are aligned in the magnetic direction of the precessional spin current magnetic layer. The magnetization direction of the precessional spin current magnetic layer is free to follow precession of the magnetization direction of the free magnetic layer, thereby causing spin transfer torque to assist switching of the magnetization vector of the free magnetic layer.

In an embodiment of the magnetic device, the magnetization direction of the magnetization vector of the precessional spin current magnetic layer is in the fifth plane.

In an embodiment of the magnetic device, the magnetization direction of the precessional spin current magnetic layer has a magnetization component in the fifth plane which can freely rotate in the fifth plane.

In an embodiment of the magnetic device, the material having the face centered cubic (fcc) crystal structure is permalloy comprising nickel (Ni) and iron (Fe).

In an embodiment of the magnetic device, the precessional spin current magnetic layer comprises an Fe layer, an Ru layer and a face centered cubic crystal structure layer comprising the material having the face centered cubic crystal structure. The Fe layer can be disposed over the non-magnetic spacer, the Ru layer can be disposed over the Fe layer, and the face centered cubic crystal structure layer can be disposed over the Ru layer.

In an embodiment of the magnetic device, the material having the face centered cubic crystal structure is permalloy comprising nickel (Ni) and iron (Fe).

In an embodiment of the magnetic device, the capping layer comprises a layer of TaN.

In an embodiment of the magnetic device, the precessional spin current magnetic layer comprises an Fe layer, an Ru layer, a CoFeB layer, and a face centered cubic crystal structure layer comprising the material having the face centered cubic crystal structure. The Fe layer can be disposed over the non-magnetic spacer, the Ru layer can be disposed over the Fe layer, the CoFeB layer can be disposed over the Fe layer, and the face centered cubic crystal structure layer can be disposed over the CoFeB layer.

In an embodiment of the magnetic device, the material having the face centered cubic crystal structure is permalloy comprising nickel (Ni) and iron (Fe).

In an embodiment of the magnetic device, the capping layer comprises a layer of TaN.

In an embodiment of the magnetic device, the precessional spin current magnetic layer comprises an Fe layer, an Ru layer, a first CoFeB layer, a face centered cubic crystal structure layer comprising the material having the face centered cubic crystal structure and a second CoFeB layer. The Fe layer can be disposed over the non-magnetic spacer, the Ru layer can be disposed over the Fe layer, the first CoFeB layer can be disposed over the Fe layer, the face centered cubic crystal structure layer can be disposed over the first CoFeB layer, and the second CoFeB layer can be disposed over the face centered cubic crystal structure layer.

In an embodiment of the magnetic device, the material having the face centered cubic crystal structure is permalloy comprising nickel (Ni) and iron (Fe).

In an embodiment of the magnetic device, the capping layer comprises a layer of TaN.

In an embodiment of the magnetic device, the capping layer comprises a layer of MgO.

In an embodiment of the magnetic device, the capping layer comprises a layer Ru.

In an embodiment of the magnetic device, the precessional spin current magnetic layer comprises an Fe layer, and a NiFe layer, wherein the NiFe layer is the material having the face centered cubic crystal structure, the Fe layer being disposed over the non-magnetic spacer, the NiFe layer being disposed over the Fe layer. The precessional spin current magnetic layer further comprises a third layer being disposed over the NiFe layer.

In an embodiment of the magnetic device, the third layer comprises CoFeB.

In an embodiment of the magnetic device, the precessional spin current magnetic layer is magnetically coupled to the free magnetic layer.

In an embodiment of the magnetic device, the precessional spin current magnetic layer is electronically coupled to the free magnetic layer.

In an embodiment of the magnetic device, precession of the precessional spin current magnetic layer is synchronized to precession of the free magnetic layer.

In an embodiment of the magnetic device, the precessional spin current magnetic layer has a rotation frequency greater than zero.

In an embodiment of the magnetic device, the free magnetic layer has an effective magnetic anisotropy such that its easy magnetization axis points away from the perpendicular direction and forms an angle with respect to its perpendicular plane.

BRIEF DESCRIPTION OF THE DRAWINGS

The accompanying drawings, which are included as part of the present specification, illustrate the presently preferred embodiments and, together with the general description given above and the detailed description given below, serve to explain and teach the principles of the MTJ devices described herein.

FIG. 5 illustrates an MTJ stack for an MRAM device having a precessional spin current magnetic layer.

FIG. 13 illustrates and alternative embodiment of an MTJ stack for an MRAM device having a precessional spin current magnetic layer.

Figure 1:
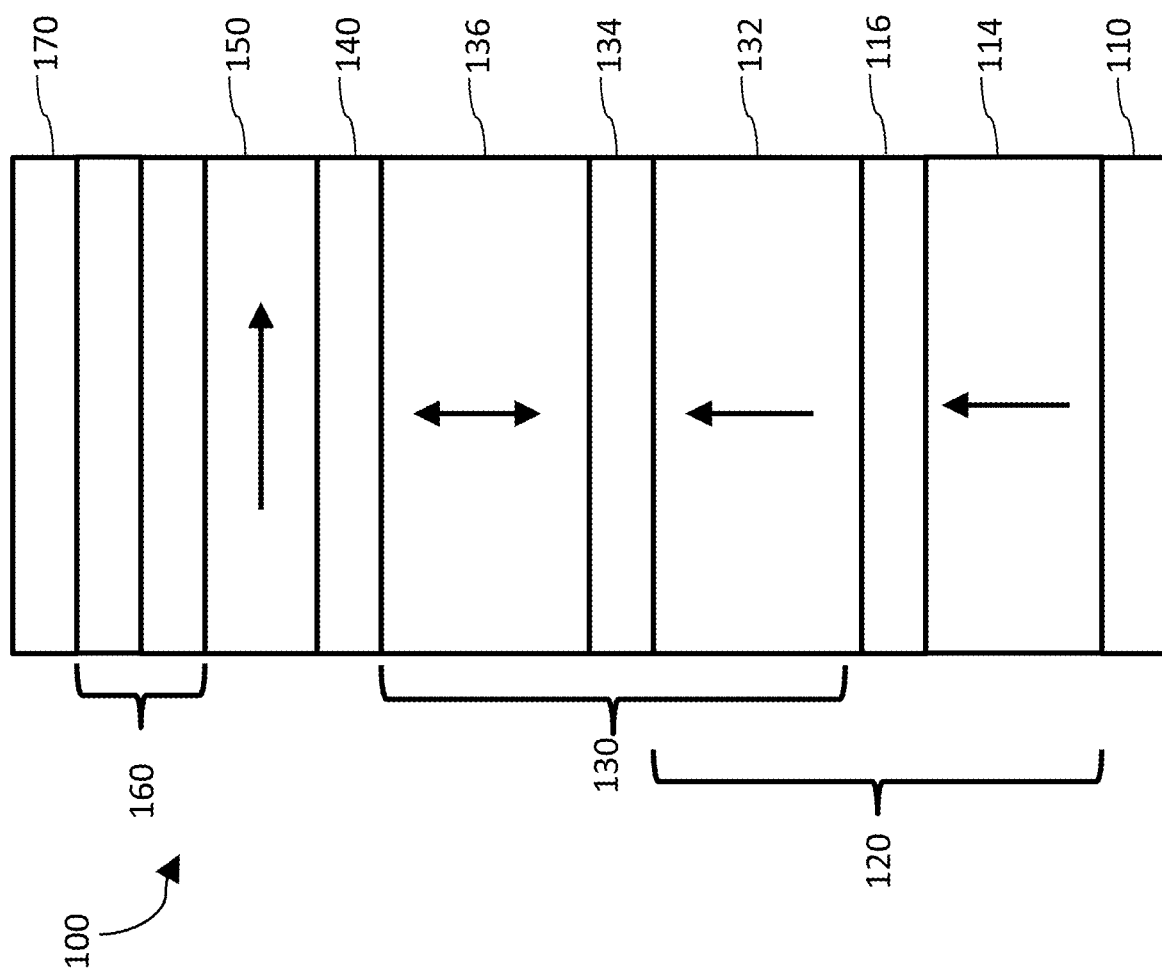
FIG. 1 illustrates a conventional MTJ stack for an MRAM device.
Figure 2:
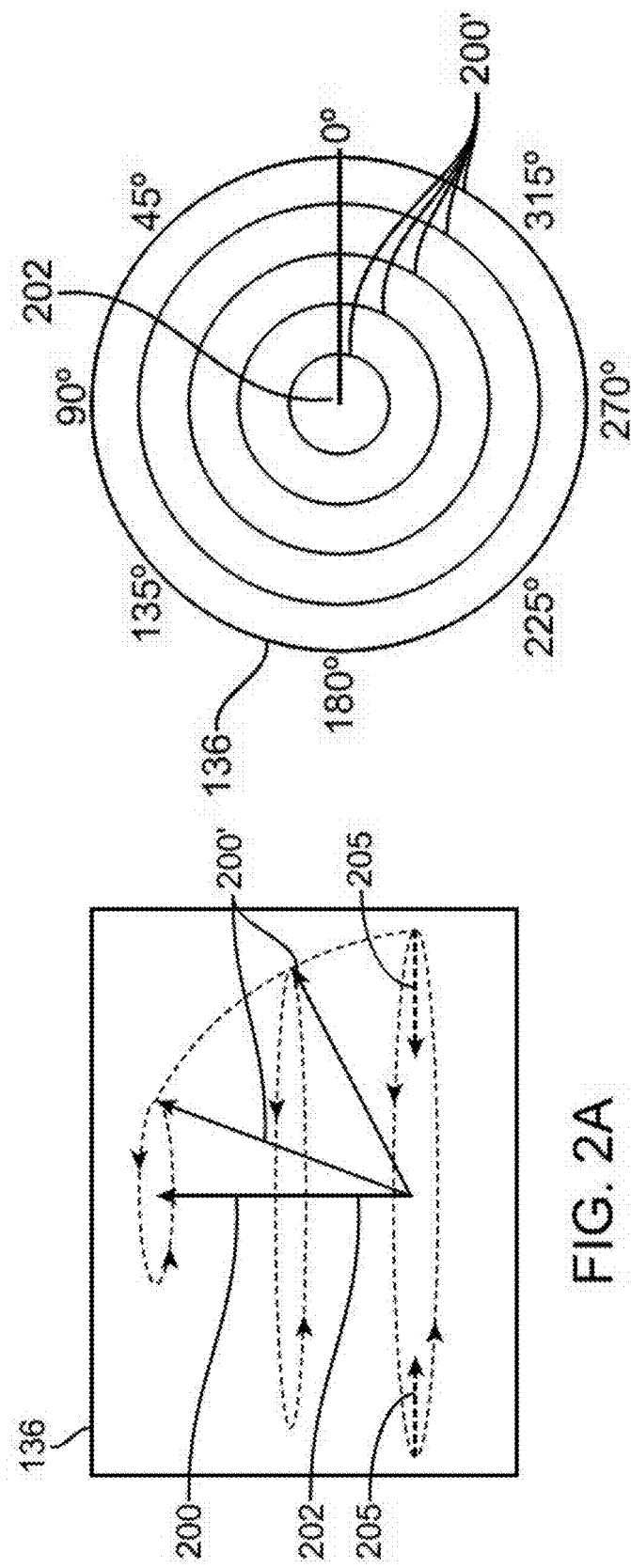
FIGS. 2A-2B illustrate the precession of the free layer in an MTJ.
Figure 3:
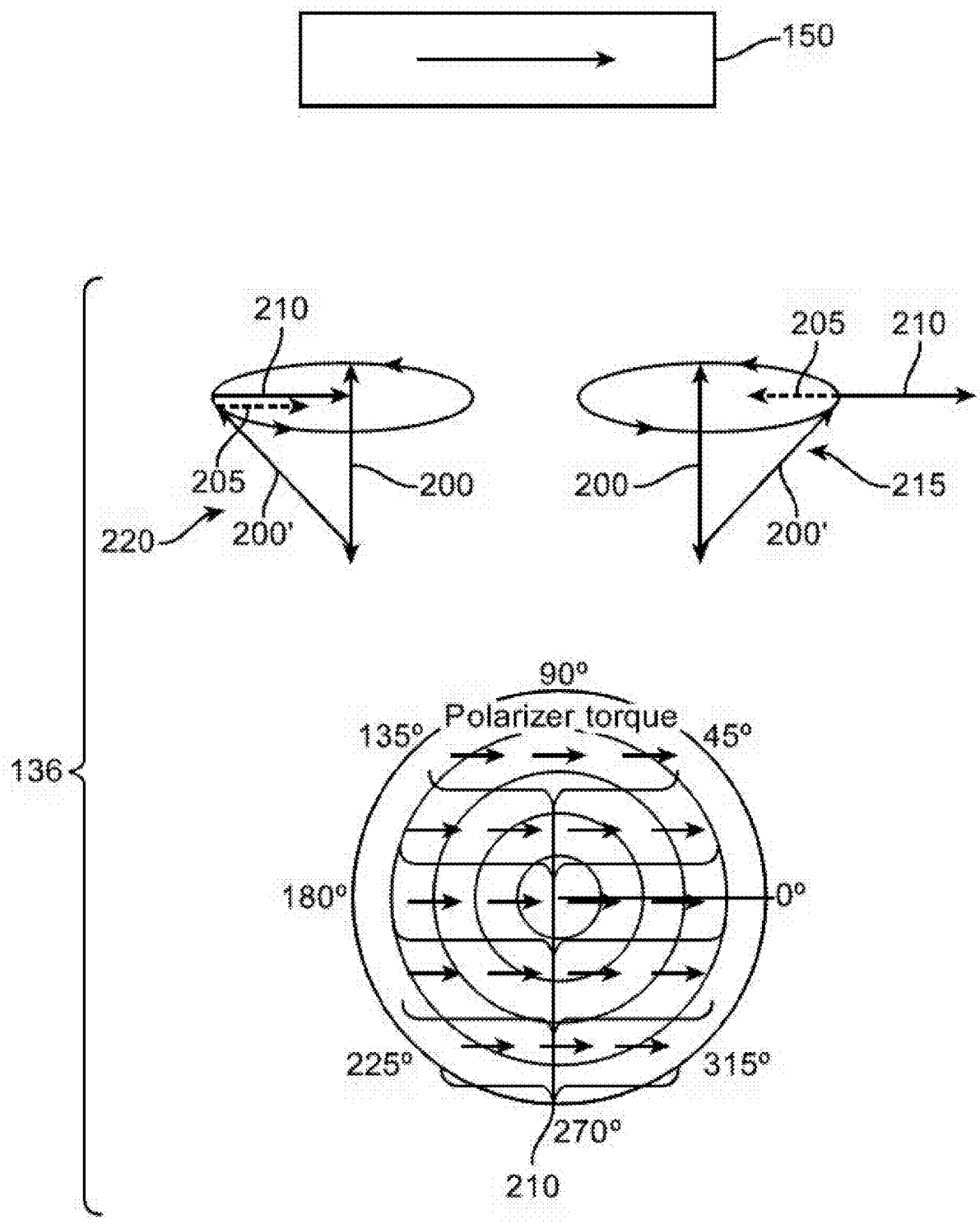
FIG. 3 illustrates the precession of the free layer in an MTJ used with a polarizing magnetic layer having a fixed magnetization direction.

The figures are not necessarily drawn to scale and the elements of similar structures or functions are generally represented by like reference numerals for illustrative purposes throughout the figures. The figures are only intended to facilitate the description of the various embodiments described herein; the figures do not describe every aspect of the teachings disclosed herein and do not limit the scope of the claims.

DETAILED DESCRIPTION

The following description is presented to enable any person skilled in the art to create and use a precessional spin current structure for a magnetic semiconductor device such as an MRAM device. Each of the features and teachings disclosed herein can be utilized separately or in conjunction with other features to implement the disclosed system and method. Representative examples utilizing many of these additional features and teachings, both separately and in combination, are described in further detail with reference to the attached drawings. This detailed description is merely intended to teach a person of skill in the art further details for practicing preferred aspects of the present teachings and is not intended to limit the scope of the claims. Therefore, combinations of features disclosed in the following detailed description may not be necessary to practice the teachings in the broadest sense, and are instead taught merely to describe particularly representative examples of the present teachings.

In the following description, for purposes of explanation only, specific nomenclature is set forth to provide a thorough understanding of the present teachings. However, it will be apparent to one skilled in the art that these specific details are not required to practice the present teachings.

This present patent document discloses a MRAM device that does not use a polarization layer having a fixed magnetization direction. Instead of a polarization layer having a fixed magnetization direction, the MRAM device described in this patent document utilizes a precessional spin current (PSC) magnetic layer 350 in conjunction with a perpendicular MTJ 330 where the in-plane magnetization component direction of the PSC layer is free to rotate (and is shown, for example, in FIGS. 5 and 7). In one embodiment, the PSC magnetic layer 350 can rotate with the free-layer magnetization precessional dynamics. This will significantly improve the impact of the spin current in overcoming the inherent damping of the free layer 336 since the PSC layer will help the spin torque overcome this damping through the entire orbital motion of the precession cycle rather on only half of the precession. This precessional spin current effect throughout the entire one-hundred eighty degree rotation significantly enhances the free-layer magnetization switching.

Figure 4:
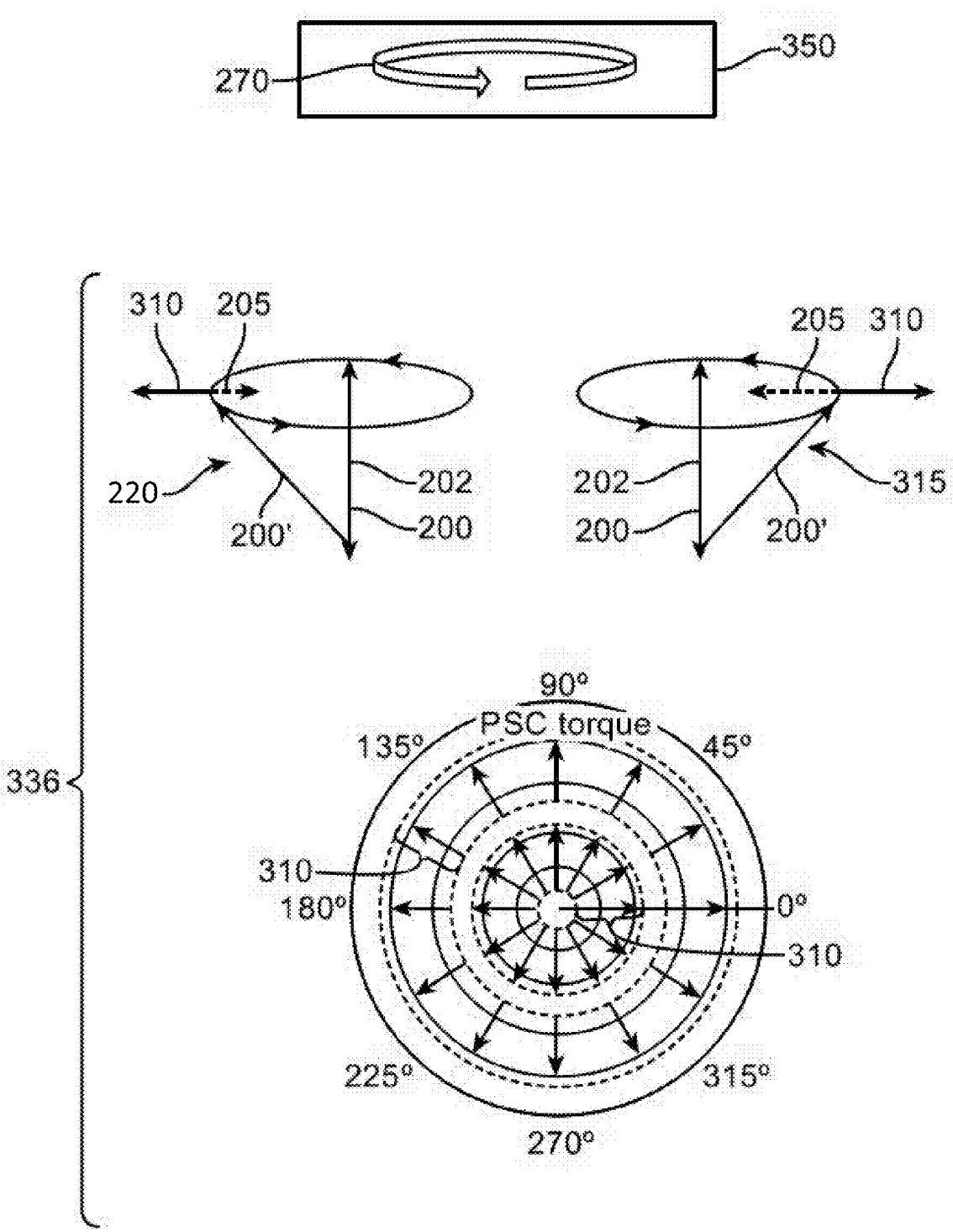
FIG. 4 illustrates the precession of the free layer in an MTJ used with a precessional spin current magnetic layer having a magnetization direction that rotates freely.

FIG. 4 shows the concept behind the MRAM device using a PSC magnetic layer 350 having magnetization vector 270 that rotates instead of a polarization layer 150 having a magnetic vector with a fixed magnetization direction. The free layer 336 in this embodiment is similar to the free layer 136 previously discussed, in that it has an inherent damping characteristic 205 that can be overcome with the assistance of spin transfer torque. However, the embodiment shown in FIG. 4 replaces polarizing layer 150 with PSC magnetic layer 350. As seen in the bottom portion of FIG. 4, the direction of the spin transfer torque 310 created by spin current passing through free layer 336 changes with the rotation of the magnetization direction of the PSC magnetic layer 350. As seen in the middle of FIG. 4, spin transfer torque 310 helps the magnetization direction 200' of the free layer 336 to precess in a cone-like manner around an axis 202 perpendicular to the plane of the layers. FIG. 4 shows a progression of rotation of the magnetic direction 200' about axis 202. As discussed, when a spin polarized current traverses the device, the magnetization of the free layer 336 precesses in a continuous manner (i.e. it turns on itself in a continuous manner as shown in FIG. 4) with maintained oscillations until the magnetic direction of free layer 336 is opposite the magnetic direction prior to the spin torque causing precession, i.e., the magnetic direction of free layer 136 switches by 180 degrees. The precessional spin current layer 350 and the free-layer 336 are magnetically and/or electronically coupled such that the magnetization direction of the magnetization vector 270 of the PSC magnetic layer 350 is free to follow the precessional rotation of the magnetic vector of the free layer 336. This can be seen in FIG. 4.

As seen in on the right-hand side of FIG. 4, the spin polarized electrons provide torque 310 helps to overcome the damping 205 in the first half of the precession 215 because the torque 310 provided by the spin polarized current is opposite that of the inherent damping 205 of the free layer 336. As discussed, the magnetization direction of magnetization vector 270 of PSC magnetic layer 350 rotates. Thus, the polarization of electrons of the spin current created by PSC magnetic layer 350 changes as well. This means that the direction of torque 310 exerted on magnetic vector of free layer 336 changes as well, which is seen on the bottom of FIG. 4. Thus, unlike prior devices having a fixed polarization magnetic layer 150, the spin of the electrons in the spin polarized current applies a torque 310 in both halves of the precession cycle, including the half of the precession cycle 220 where devices with fixed polarization magnetic layers 150 actually harmed precession. This is seen in the left-hand side of FIG. 4. As is seen, the torque 310 continues to help overcome the inherent damping 205 of free layer 136 throughout the entire precession cycle. Thus, devices using PSC magnetic structure 350 can provide spin transfer torque 310 for an entire switching cycle.

In an embodiment, the precessional vector 270 of the PSC magnetic layer 350 is free to follow the precessional rotation of the magnetic vector of the free layer 336. The magnetization direction of the free layer is switched by the spin torque 310 from the reference layer 132 where the direction of the current defines the final state.

A memory cell with a precessional spin current MTJ structure 300 is shown in FIG. 5. Memory cell 300 is formed on a substrate, which can be silicon or other appropriate materials, and can include complementary metal oxide semiconductor (CMOS) circuitry fabricated thereon. MTJ structure 300 includes one or more seed layers 320 provided at the bottom of stack 300 to initiate a desired crystalline growth in the above-deposited layers. A first synthetic antiferromagnetic (SAF) layer 322 is disposed over seed layer 320. First SAF layer 322 is a magnetic layer having a magnetization direction that is perpendicular to its plane. Details of the construction of first SAF layer 322 will be discussed below. An anti-ferromagnetic (AFM) coupling layer 324 is disposed over first SAF layer 322. AFM coupling layer 324 is a non-magnetic layer. A second SAF layer 326 is disposed over AFM coupling layer 324. Second SAF layer 326 has a magnetic direction that is perpendicular to its plane. The magnetic direction of first SAF layer 322 and second SAF layer 326 are antiparallel, as is shown in FIG. 5. Details of the construction of second SAF layer 326 will also be discussed below. A ferromagnetic coupling layer 328 is placed over second SAF layer 326. Ferromagnetic coupling layer 328 is a non-magnetic layer. MTJ 330 is deposited over ferromagnetic coupling layer 328. MTJ 330 includes reference layer 332, tunneling barrier layer (i.e., the insulator) 334 and free layer 336. Reference layer 332 of MTJ 330 is fabricated over ferromagnetic coupling layer 328. Tunneling barrier layer 334 of MTJ 330 is fabricated over reference layer 332. Free layer 336 of MTJ 330 is fabricated over tunneling barrier layer 334. Note that synthetic antiferromagnetic layer 326 technically also includes ferromagnetic coupling layer 328 and reference layer 332, but are shown separately here for explanation purposes.

As shown in FIG. 5, the magnetization vector of reference layer 332 has a magnetization direction that is perpendicular to its plane. As also seen in FIG. 5, free layer 336 also has a magnetization vector that is perpendicular to its plane, but its direction can vary by 180 degrees. In addition, free layer 336 design may include magnetization of the free layer 336 pointing a few degrees away from its perpendicular axis. The tilted angle of the free layer magnetization can be due to interaction with the PSC magnetic layer 350 or due to magnetocrystalline anisotropy, will additionally help switching of the free layer magnetization by improving the initiation of the switching. Because reference layer 332 and free layer 336 each have a magnetic direction that is perpendicular to their respective planes, MTJ 330 is known as a perpendicular MTJ.

A nonmagnetic spacer 340 is disposed over of MTJ 330. PSC magnetic layer 350 is disposed over nonmagnetic spacer 340. In one embodiment, PSC magnetic layer 350 has a magnetization vector having a magnetic direction parallel to its plane, and is perpendicular to the magnetic vector of the reference layer 332 and free layer 336. One or more capping layers 370 can be provided on top of PSC layer 350 to protect the layers below on MTJ stack 300.

Nonmagnetic spacer 340 has a number of properties. For example, nonmagnetic spacer 340 physically separates free layer 336 and PSC layer 350. Nonmagnetic spacer 340 promotes strong magnetic and/or electronic coupling such that the magnetic direction of the PSC magnetic layer 350 is free to follow the precession cycle of the free layer 336. In other words, nonmagnetic spacer 340 couples the magnetic direction of the PSC magnetic layer 350 to the magnetic direction of the free layer 336. Nonmagnetic spacer 340 transmits spin current efficiently from the PSC magnetic layer 350 into the free layer 336 because it preferably has a long spin diffusion length. Nonmagnetic spacer 340 also promotes good microstructure and high tunneling magnetoresistance (TMR) and helps keep the damping constant of the free layer 336 low.

Figure 10:
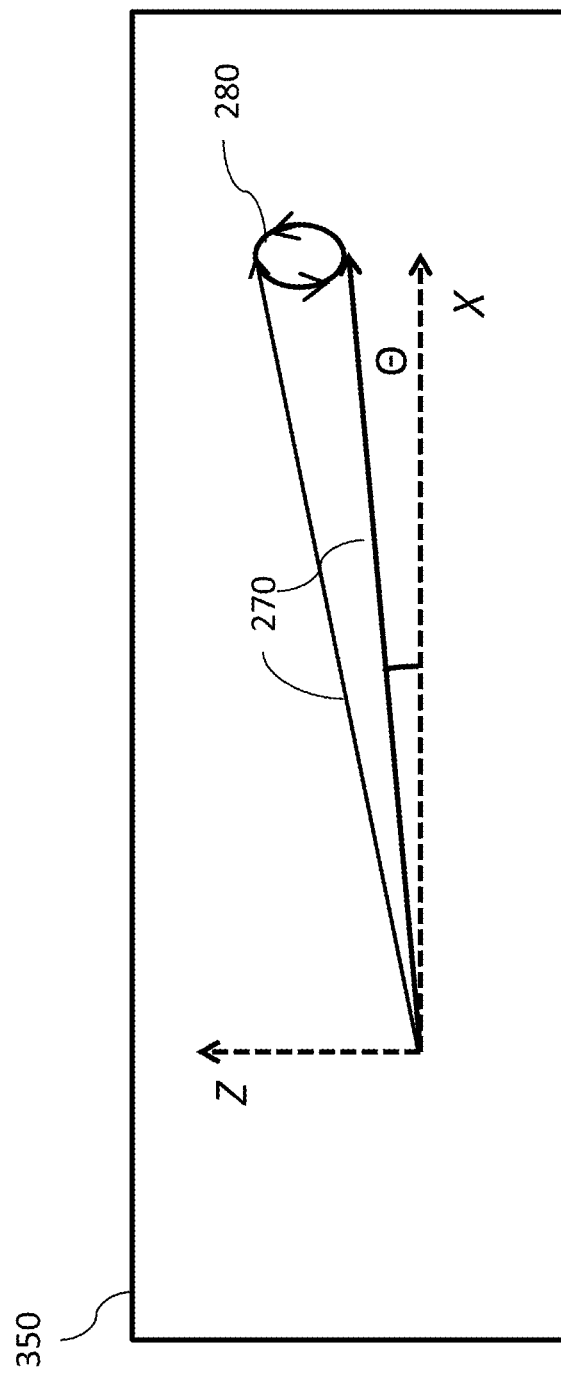
FIG. 10 illustrates the magnetic direction of the precessional spin current magnetic layer of an embodiment.

PSC magnetic layer 350 has at least the following properties. First, in one embodiment, the magnetization direction of PSC magnetic layer 350 is in the plane of the layer but is perpendicular to magnetization direction of free layer 336. In other embodiments such as shown in FIG. 10, the magnetization direction of PSC magnetic layer 350 can have a horizontal component X and perpendicular component Z such that the angle $\Theta$ between the plane of free layer 336 and the magnetic direction 270 of PSC magnetic layer 350 can be anywhere between 0 and less than 90 degrees, although, as discussed, the angle is as close to zero as feasible so that the magnetic direction remains in-plane. Likewise, as shown, the magnetization vector can also spin in a rotational vector, shown in FIG. 10 as cone-like rotation 280 while precessing about its perpendicular axis. Note that the angle $\Theta$ between the plane of free layer 336 and the magnetic direction 270 of PSC magnetic layer 350 will vary in this situation.

As seen in FIG. 5 and discussed above, PSC magnetic layer 350 has a magnetic direction that is in the plane of the layer. Because materials having face centered cubic (fcc) crystalline structures tend to have high in-plane anisotropy, they are used in the embodiments described herein for in-plane PSC magnetic layer 350. In an embodiment, PSC magnetic layer 350 is constructed of a NiFe alloy having an fcc crystal structure. Ni—Fe compositions like permalloy (which comprises approximately 80% nickel and 20% Fe iron) have high magnetic permeability, soft magnetic properties (e.g., low easy axis coercivity and virtually no hard axis coercivity) and provide good spin polarization of electrons passing there through. Note also that permalloy does not possess perpendicular magneto crystalline anisotropy ("PMA"). PMA is undesirable for in-plane magnetic layers, and is another reason to use permalloy.

Using a Ni—Fe permalloy results in an in-plane PSC layer 350 with magnetic moments that are lower than the magnetic moment of free layer 336, and can facilitate desired magnetization of PSC layer 350.

Seed layer 320 in the MTJ structure shown in FIG. 5 preferably comprises Ta, TaN, Cr, Cu, CuN, Ni, Fe or alloys thereof. First SAF layer 322 preferably comprises either a Co/Ni or Co/Pt multilayer structure. Second SAF layer 326 preferably comprises either a Co/Ni or Co/Pt multilayer structure plus a thin non-magnetic layer comprised of tantalum having a thickness of two to five Angstroms and a thin CoFeB layer (0.5 to three nanometers). Anti-ferromagnetic coupling layer 324 is preferably made from Ru having thickness in the range of three to ten Angstroms. Ferromagnetic coupling layer 328 can be made of Ta, W, Mo or Hf having a thickness in the range of one to eight Angstroms. Tunneling barrier layer 334 is preferably made of an insulating material such as MgO, with a thickness of approximately ten Angstroms. Free layer 336 is preferably made with CoFeB deposited on top of tunneling barrier layer 334. Free layer 336 can also have layers of Fe, Co, Ni or alloys thereof. Spacer layer 340 over MTJ 330 can be any nonmagnetic material such as 2 to 20 Angstroms of ruthenium, 2-20 Angstroms of Ta, 2-20 Angstroms of TaN, 2-20 Angstroms of Cu, 2-20 Angstroms of CuN, or 2-20 Angstroms of MgO.

The manner in which a bit is written using the precessional spin current MTJ structure 300 will now be described. In particular, an electrical current is supplied, for example, by a current source 375, which passes electrical current through the precessional spin current magnetic layer 350, the non-magnetic spacer 340, the free magnetic layer 336, the non-magnetic tunneling barrier layer 334, and the reference layer 332. The electrons of the electrical current passing through the precessional spin current magnetic layer 350 become spin polarized in the magnetic direction thereof, thus creating a spin polarized current that passes through non-magnetic spacer layer 340, free magnetic layer 336, tunneling barrier layer 334, and reference magnetic layer 332. The spin polarized current exerts a spin transfer torque on free magnetic layer 336, which helps overcome the inherent damping of the magnetic material making up the free layer 336. This assists the free magnetic layer 336 to precess about its axis, which is shown in FIG. 4.

Once the magnetic direction of the free magnetic layer 336 begins to precess, the magnetic direction of the PSC magnetic layer 350 begins to rotate, as is also seen in FIG. 4. This rotation is caused by the magnetic and/or electronic coupling between the free magnetic layer 336 and the PSC magnetic layer 350 through the non-magnetic spacer 340. The rotation of the magnetic direction of the PSC magnetic layer 350 causes the spin polarization of the electrons of the electrical current to change in a manner corresponding to the magnetic direction of the PSC magnetic layer 350. Because the spin of the electrons of the spin polarized current corresponds to the magnetic direction of PSC magnetic layer 350, and the magnetic direction of PSC magnetic layer 350 follows the precession of free magnetic layer 336, the spin of the electrons applies spin transfer torque to the free layer 336 in a direction that varies through an entire switching cycle. Thus, devices using PSC magnetic layer 350 can provide spin transfer torque 205 for an entire switching cycle.

In particular, the structure described herein utilizing PSC magnetic layer 350 and spacer layer 340 creates precessional magnetization that provides spin current to the free layer 336 of an MTJ throughout the whole precession cycle and therefore significantly enhance the free layer switching process, which will result in faster write times.

Figure 6A:
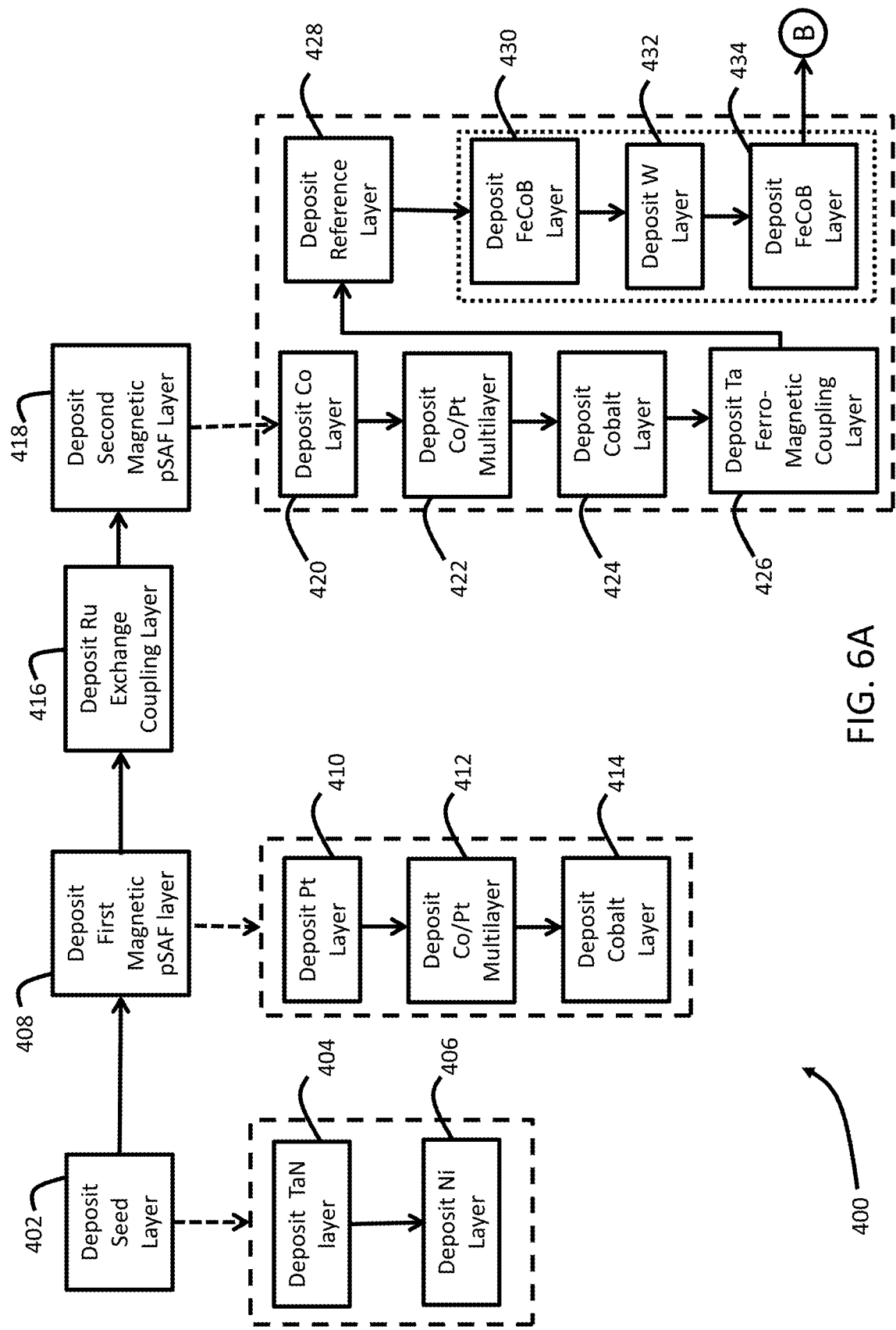
FIGS. 6A-6B are flow charts showing manufacturing steps for an MRAM device having a precessional spin current magnetic layer.
Figure 7:
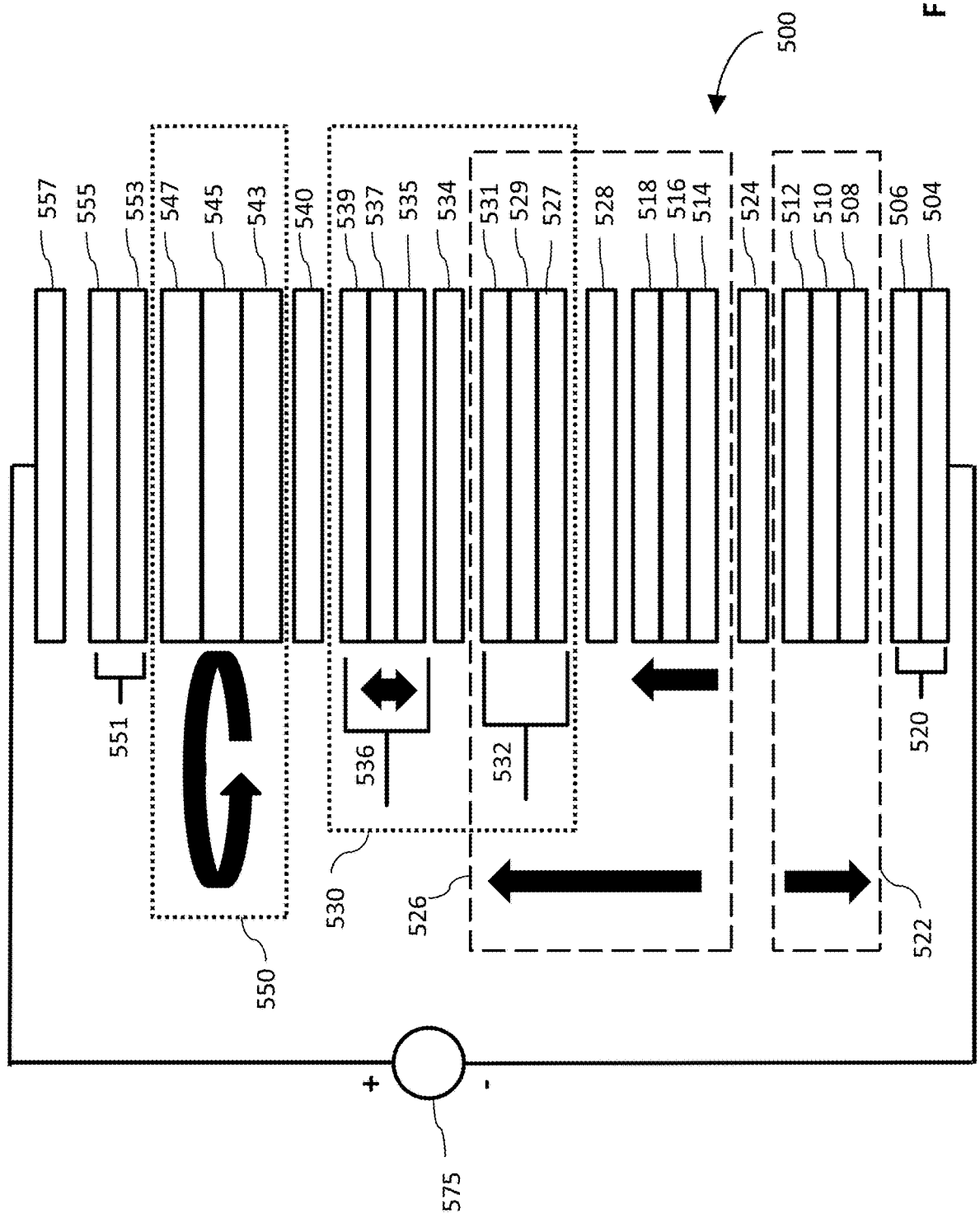
FIG. 7 illustrates an embodiment of an MTJ stack for an MRAM device having a precessional spin current magnetic layer.

A flowchart showing a method 400 of manufacturing an embodiment of an MRAM stack 500 is illustrated in FIGS. 6A-BB. MRAM stack 500 is illustrated in FIG. 7. MRAM stack will be formed on a substrate, which in an embodiment can be a silicon substrate and in other embodiments can be any other appropriate substrate material. In step 402 seed layer 520 is deposited. In an embodiment, seed layer 520 can be constructed by depositing, at step 404, a TaN layer 504 and then, at step 406, depositing a Cu layer 506. In an embodiment, TaN layer 504 is a thin film having a thickness of five nanometers and Cu layer 506 is a thin film having a thickness of five nanometers. In alternative embodiments, TaN layer 504 can have a thickness ranging from 2 to 20 nanometers while Cu layer 506 can have a thickness ranging from 0 to 20 nanometers.

At step 408, first perpendicular synthetic antiferromagnetic layer 522 is deposited. In an embodiment, first perpendicular synthetic antiferromagnetic layer 522 can comprise a Pt layer 508 (deposited at step 410), a Co/Pt multilayer 510 (deposited at step 412) and a Co layer 512 (deposited at step 414). In an embodiment, Pt layer 508 is a Pt thin film having a thickness of 0.7 nanometers. In other embodiments, Pt layer 508 can comprise a Pt thin film having a thickness ranging from 0.5 to 20 nanometers. Co/Pt multilayer 510 can comprise a thin film of Co having a thickness of 0.6 nanometers and a thin film of Pt having a thickness of 0.4 nanometers. In other embodiments, the Co layer of Co/Pt multilayer 510 can have a thickness of 0.1 to 1 nanometers and the Pt layer of Co/Pt multilayer 510 can have a thickness ranging from 0.1 to 1 nanometers. In an embodiment, Co/Pt multilayer 510 is repeated such that Co/Pt multilayer 510 comprises six Co/Pt multilayers. In an embodiment, Co layer 512 is a thin film having a thickness of 0.6 nanometers. In other embodiments, Co layer 512 can have a thickness ranging from 0.1 to 1.0 nanometers.

As seen in FIG. 7, first perpendicular synthetic antiferromagnetic layer 522 has a magnetic vector having a direction perpendicular to its plane. The magnetic direction of first perpendicular synthetic antiferromagnetic layer 522 is fixed and will not change directions (i.e., rotate or precesses) under normal operating conditions. The thickness of the layers are selected to have high anisotropy while managing stray fields on free layer 536.

At step 416, exchange coupling layer 524 is deposited. In an embodiment, exchange coupling layer 524 comprises an Ru thin film having a thickness of 0.8 nanometers, and in other embodiments can range from 0.3 to 1.5 nanometers.

At step 418, second perpendicular synthetic antiferromagnetic layer 526 is fabricated. Fabrication of second perpendicular synthetic antiferromagnetic layer 526 (step 418) comprises many steps, and includes fabrication of reference layer 532 of magnetic tunnel junction 530, as will be discussed. At step 420, Co layer 514 is deposited. In an embodiment, Co layer 514 is a thin film having a thickness of 0.3 nanometers and in other embodiments, can have a thickness of 0.1 to 1.0 nanometers. Thereafter, at step 420, a Co/Pt multilayer 516 is deposited. In an embodiment, Co/Pt multilayer 516 comprises a thin film of Co having a thickness of 0.6 nanometers and a thin film of Pt having a thickness of 0.4 nanometers. In other embodiments, the thin film of Co can have a thickness of 0.1 to 1.0 nanometers while the thin film of Pt can have a thickness of 0.1 to 1.0 nanometers. Moreover, Co/Pt multilayer 516 can comprise multiple Co/Pt layers as described herein. In an embodiment, Co/Pt multilayer 516 has two Co/Pt multilayers with the thickness properties described above. After depositing Co/Pt multilayer 516 at step 422, the method described herein deposits a cobalt layer 518 at step 424. In an embodiment, Co layer 518 is a thin film having a thickness of 0.6 nanometers, while other embodiments, Co layer 518 can have a thickness in the range of 0.1 to 1.0 nanometers. Together, Co layer 514, Co/Pt layer 516 and Co layer 518 form a magnetic structure. The magnetic direction of the combination of Co layer 514, Co/Pt layer 516 and Co layer 518 is fixed, perpendicular to the plane of each layer, and antiparallel to the magnetic direction of first perpendicular synthetic antiferromagnetic layer 522. The magnetic properties of the combination of Co layer 514, Co/Pt layer 516 and Co layer 518 will interact with the magnetic properties of reference layer 532 of second perpendicular synthetic antiferromagnetic layer 526 to generate a magnetic vector having a fixed magnetic direction that is also perpendicular to the plane of each layer of second perpendicular synthetic antiferromagnetic layer 526 (although variations of a several degrees are within the scope of what is considered perpendicular) and antiparallel to the magnetic direction of first perpendicular synthetic antiferromagnetic layer 522. These magnetic vectors are illustrated and FIG. 7, where it can be seen that the perpendicular synthetic antiferromagnetic layer 526 has a fixed and perpendicular magnetic direction that is antiparallel to the magnetic direction of first perpendicular synthetic antiferromagnetic layer 522.

After deposition of Co layer 518 (step 424), a ferromagnetic coupling layer 528 is deposited (step 426). In an embodiment, ferromagnetic coupling layer 528 is a thin film of Ta having a thickness of 0.2 nanometers. In other embodiments, ferromagnetic coupling layer 528 can be a thin film of Ta, W, Hf or Mo (or other appropriate material) having a thickness ranging from 0.1 to 1.0 nanometers.

After deposition of ferromagnetic coupling layer 528 at step 426, reference layer 532 is deposited (step 428). Step 428, fabrication of reference layer 532, comprises several steps, including deposition of magnetic layer 527 (step 430), deposition of a tungsten (W) layer 529 (step 432) and deposition of magnetic layer 531 (step 434). In an embodiment, magnetic layer 527 comprises a thin film of CoFeB having a thickness of 0.6 nanometers, where the alloy is sixty (60) percent Fe, twenty (20) percent Co and twenty (20) percent B. W layer 529 comprises a thin film of W having a thickness of 0.2 nanometers. Magnetic layer 531 comprises a thin film of CoFeB having a thickness of 0.8 nanometers, where the alloy is sixty (60) percent Fe, twenty (20) percent Co and twenty (20) percent B. In other embodiments, magnetic layer 527 can comprise a thin film of CoFeB having a thickness ranging from 0.5 to 1.0 nanometers, W layer 529 can comprise a thin film having a thickness of 0.1 to 1.0 nanometers, and magnetic layer 531 can comprise a thin film of CoFeB having a thickness of 0.5 to 2.0 nanometers.

Reference layer 532 is constructed using magnetic materials so that it has a magnetic vector having a magnetic direction perpendicular to its plane, is fixed in direction, and is antiparallel to the magnetic direction of first perpendicular synthetic antiferromagnetic layer 522. As discussed and as seen in FIG. 7, the collective materials of the second perpendicular synthetic antiferromagnetic layer 526 have a magnetic vector having a magnetic direction that is perpendicular to the plane of each of its collective layers, is fixed in direction and antiparallel to the magnetic direction of first perpendicular synthetic antiferromagnetic layer 522. Note that the particular magnetic direction of first perpendicular synthetic antiferromagnetic layer 522 and second perpendicular synthetic antiferromagnetic layer 526 is not important, so long as they are perpendicular to their respective planes and antiparallel to each other.

As discussed, reference layer 532 is one of the structures forming magnetic tunnel junction 530. The flowchart showing the method of manufacturing MRAM stack 500, including magnetic tunnel junction 530, continues on FIG. 6B. At step 436, non-magnetic tunneling barrier layer 534 is deposited on reference layer 532. In an embodiment, non-magnetic tunneling barrier 534 is formed as a thin film of an insulating material, e.g., MgO. The purpose of non-magnetic tunneling barrier 534 is discussed above. Manufacture of magnetic tunnel junction 530 continues at step 438, when free layer 536 is deposited over non-magnetic tunneling barrier 534. Fabrication of free layer 536 comprises several steps. At step 440, a magnetic layer 535 is deposited over non-magnetic tunneling barrier 534. In an embodiment, magnetic layer 535 is comprised of a thin film of CoFeB having a thickness of 1.2 nanometers, where the alloy is sixty (60) percent Fe, twenty (20) percent Co and twenty (20) percent B. In other embodiments, magnetic layer 535 can comprise a thin film of CoFeB or other suitable magnetic material having a thickness ranging from 0.5 to 2.0 nanometers. Manufacture of free layer 535 continues at step 442, where a W layer 537 is deposited. In an embodiment, W layer 537 comprises a thin film of W having a thickness of 0.2 nanometers, and in other embodiments can a thickness ranging from 0.1 to 1.0 nanometers. At step 444, manufacture of free layer 536 continues with forming magnetic layer 539. In an embodiment, magnetic layer 535 can comprise a thin film of CoFeB having a thickness of 0.9 nanometers, where the alloy is sixty (60) percent Fe, twenty (20) percent Co and twenty (20) percent B. In other embodiments, magnetic layer 539 can comprise a thin film of CoFeB or other suitable magnetic material having a thickness ranging from 0.5 to 1.5 nanometers.

Collectively, magnetic layers 535 and 539, along with non-magnetic W layer 537, form free magnetic layer 536. Free magnetic layer 536 has a magnetic vector having a magnetic direction perpendicular to its plane. In addition, free magnetic layer 536 design may include magnetization of the free layer 536 pointing a few degrees away from its perpendicular axis. The tilted angle of the free layer magnetization can be due to interaction with the PSC magnetic layer 550 or due to magnetocrystalline anisotropy, will additionally help switching of the free layer magnetization by improving the initiation of the switching. As seen in FIG. 7, the magnetic direction of free magnetic layer 536 can switch one hundred eighty (180) degrees from one direction to another, antiparallel, direction.

After fabrication of magnetic tunnel junction 530 at step 438, step 446 is performed in which a spacer 540 is deposited. In an embodiment, spacer 540 can comprise a thin film of MgO having a thickness of 0.8 nanometers. In other embodiments, spacer layer 540 can comprise a thin film of MgO having a thickness ranging from 0.5 to 1.5 nanometers. In other embodiments, spacer layer 540 can be constructed as described in U.S. patent application Ser. No. 14/866,359, filed Sep. 25, 2015, and entitled "Spin Transfer Torque Structure For MRAM Devices Having A Spin Current Injection Capping Layer." U.S. patent application Ser. No. 14/866,359 is hereby incorporated by reference in its entirety.

Figure 6B:
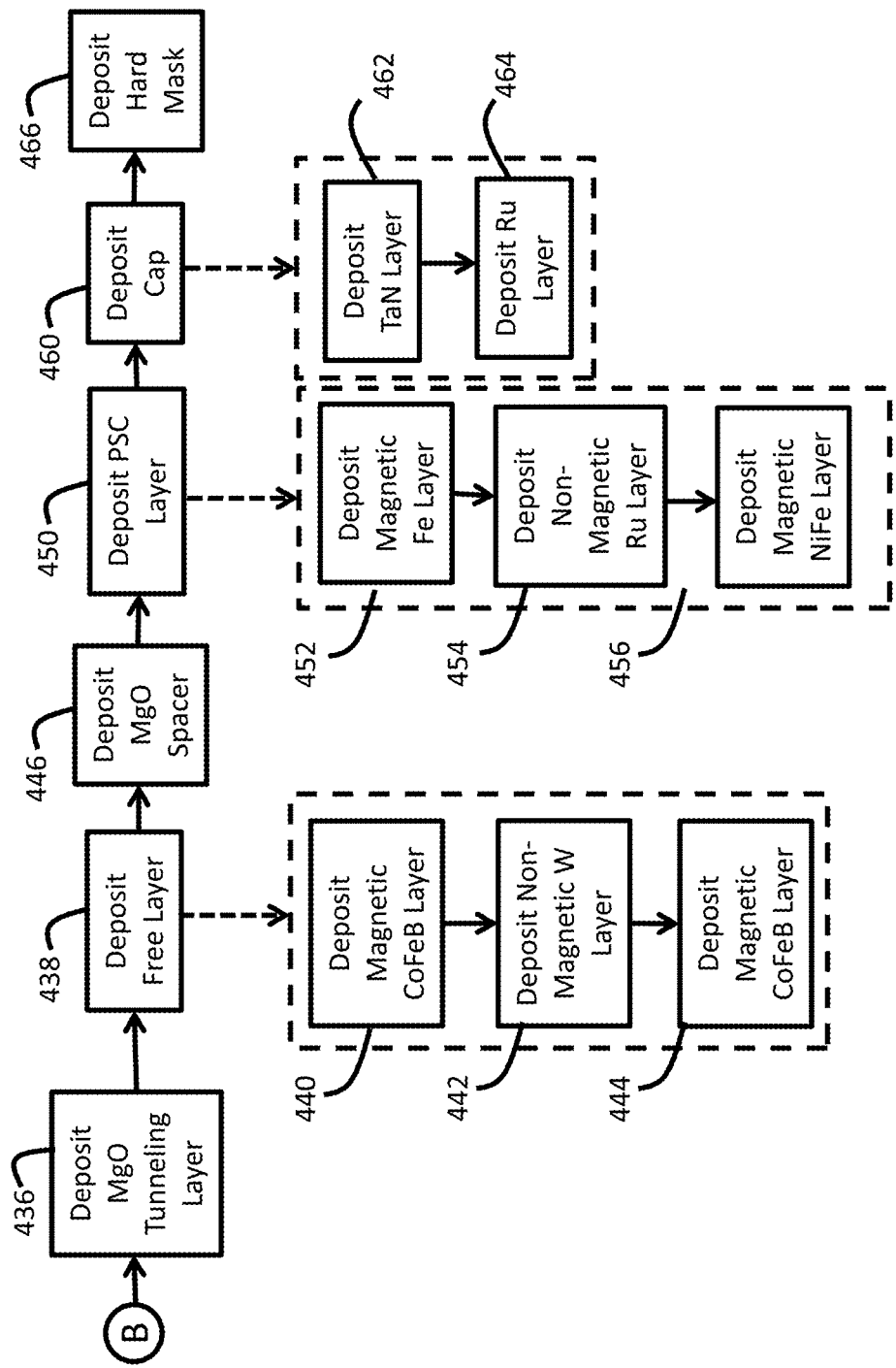

After deposition of spacer layer 540, precessional spin current magnetic layer 550 is deposited (step 450). As seen in FIG. 6B, manufacture of precessional spin current magnetic layer 550 comprises several steps. At step 452, magnetic Fe layer 543 is fabricated over spacer layer 540. In an embodiment, magnetic Fe layer 543 comprises a thin film of Fe having a thickness of 0.6 nanometers. In other embodiments, magnetic Fe layer 543 can comprise a thin film of Fe having a thickness ranging from 0.5 to 2.0 nanometers.

At step 454, Ru layer 545 is deposited over magnetic Fe layer 543. In an embodiment, Ru layer 545 can comprise a thin film of Ru having a thickness of 1.5 nanometers, and in other embodiments can comprise a thin film of Ru having a thickness ranging from 0.4 to 5.0 nanometers.

At step 456, a magnetic NiFe layer 547 is deposited. In an embodiment, magnetic NiFe layer 547 comprises eighty (80) percent Ni and twenty (20) percent Fe, and has a thickness of 3.0 nanometers. In other embodiments, NiFe layer 547 can have a thickness ranging between 0.5 to 5.0 nanometers. NiFe layer 547 can also comprise multiple layers. In one such embodiment, layer 547 comprises a thin film of CoFeB and NiFe. In another embodiment, layer 547 comprises NiFe layer in between layers of CoFeB.

After manufacture of precessional spin current magnetic layer 550 at step 450, a capping layer 551 is deposited (step 460). Manufacture of capping layer 551 can comprise depositing TaN layer 553 (step 462) and depositing Ru layer (step 464). In an embodiment, TaN layer 553 comprises a thin film of TaN having a thickness of 2.0 nanometers, while in other embodiments, TaN layer 553 can have a thickness ranging from 1.0 to 5.0 nanometers. In an embodiment, Ru layer 555 comprises a thin film of Ru having a thickness of ten (10) nanometers, while in other embodiments, Ru layer 555 can have a thickness ranging from 1.0 to 20 nanometers. In other embodiments, capping layer 551 comprise a layer of Ru (with no TaN) or a layer of MgO. The selection of a particular capping structure is influenced, among several reasons, by the particular annealing temperature to be used. This is due to the fact that these particular materials will have different characteristics depending on the annealing temperature.

Finally, at step 466, a hard mask 557 is deposited. Hard mask 557 can comprise a layer of TaN having a thickness of 7.0 nanometers.

As shown in FIG. 7, precessional spin current magnetic layer 550 has magnetic direction that is in in-plane, and which can freely rotate in any magnetic direction. It is desirable for the magnetic vector of precessional spin current magnetic layer 550 to remain in-plane while it rotates. This is due to the fact, as seen in FIG. 4, that the more the magnetic vector of precessional spin current magnetic layer 550 remains in plane during rotation, the more torque can be excerpted on the magnetic free layer 536, which aids in overcoming the damping 205 of free layer 536. Because it is desirable to keep the magnetic vector of precessional spin current magnetic layer 550 in-plane during rotation, the embodiments described herein utilize materials having high in-plane anisotropy.

Permalloy is a NiFe alloy having a face centered crystal structure. Permalloy comprised of approximately eighty (80) percent Ni and twenty (20) percent Fe and has soft magnetic properties (e.g., low easy axis coercivity and almost no hard axis coercivity), and has good spin polarization. Using permalloy for layer 547 of precessional spin current magnetic layer 550 (which resides at the PSC layer 550-TaN layer 551 interface) thus provides an in-plane magnetic direction with magnetic moments that can be lower than the free layer magnetization.

Thus, in addition to NiFe layer 547, precessional spin current magnetic layer 550 can include an additional layer of Co, CoFeB or other Co alloys at the interface with TaN layer 551 and also at the interface of NiFe layer 547 and Ru layer 545. One example of which could be a thin film of CoFeB (not shown in FIG. 7) in between NiFe layer 547 and TaN layer 551 as well as between NiFe layer 547 and Ru layer 545. In such an embodiment, the CoFeB layer in between NiFe layer 547 and Ru layer 545 can have a thickness ranging from one Angstrom to ten Angstroms. Use of CoFeB layer can avoid the strong intermixing of NiFe layer 547 with TaN layer 551. Note that in other embodiments, precessional spin current magnetic layer 550 may also have other layers to improve the interface properties/performance in between NiFe layer 547, TaN layer 551 and Ru layer 545. Examples of such additional materials include Co or alloys including Co.

Figure 8:
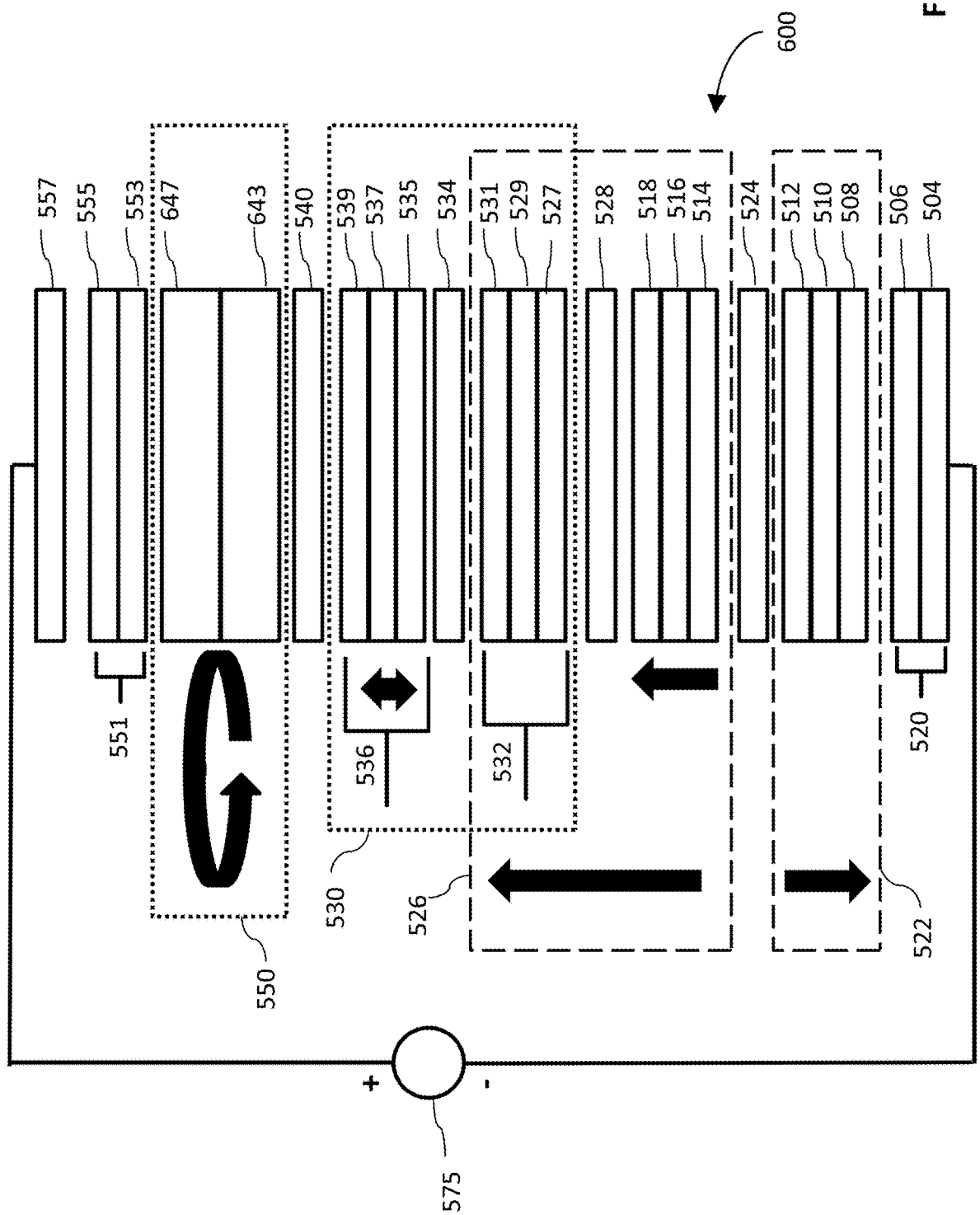
FIG. 8 illustrates an embodiment of an MTJ stack for an MRAM device having a precessional spin current magnetic layer.
Figure 9:
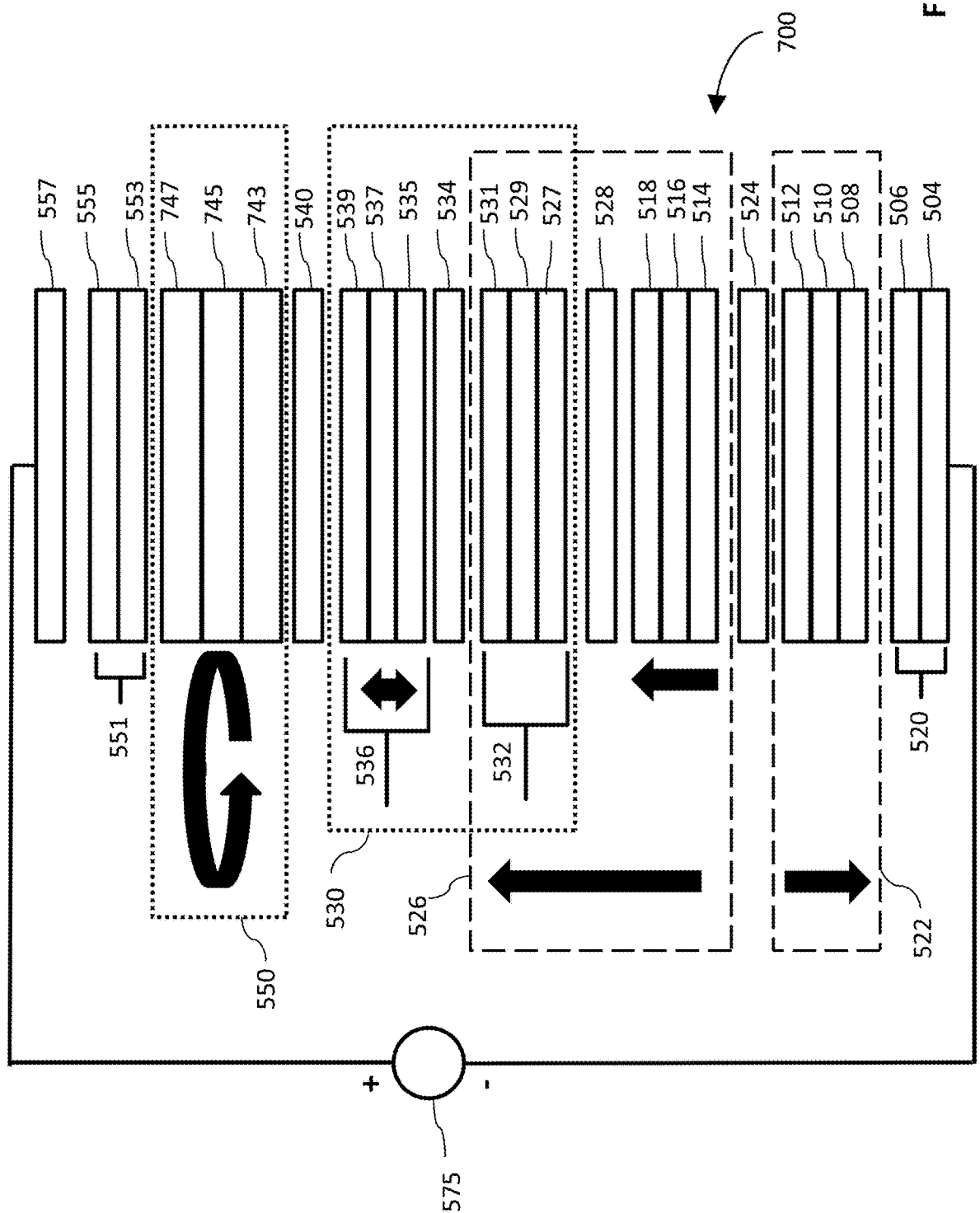
FIG. 9 illustrates an embodiment of an MTJ stack for an MRAM device having a precessional spin current magnetic layer.

Other materials can be used at the interface of precessional spin current magnetic layer 550 and TaN layer 551, examples of which include Co, Fe, and alloys containing these elements such as CoFeB. Likewise, choosing different Co—Fe ratios with various interfacial layers may make it possible to obtain desired magnetizations for precessional spin current magnetic layer 550. Other embodiments of MRAM stack devices are shown in FIGS. 8 and 9. In these embodiments, the structures are similar to the embodiment described in the context of FIGS. 6A-6B and FIG. 7, the difference being the structure of the precessional spin current magnetic layer 550. In the MRAM device 600 shown in FIG. 8, precessional spin current magnetic layer 550 comprises Fe layer 643 disposed over spacer 540. Fe layer 643 can comprise a thin film of Fe having a thickness of 0.5 to 1.0 nanometers. In this embodiment, precessional spin current magnetic layer 550 further comprises CoFeB layer 647. CoFeB layer 647 can have a thickness ranging from 0.5 to 4.0 nanometers.

Another embodiment of MRAM stack 700 is shown in FIG. 9. In the embodiment shown in FIG. 9, precessional spin current magnetic layer 550 comprises Fe layer 743 over spacer 540. Fe layer 743 comprises a thin film of Fe having a thickness ranging from 0.5 to 1.0 nanometers. NiFe layer 745 is disposed over Fe layer 743. NiFe layer 745, such as permalloy, as discussed, is a material having a face centered cubic crystal structure and can have a thickness ranging from 1.0 to 5.0 nanometers. As in embodiments discussed herein, NiFe layer 745 can be eighty percent Ni and twenty percent Fe. In this embodiment, precessional spin current magnetic layer 550 also comprises CoFeB layer 747. CoFeB layer 747 can have a thickness ranging from 0.5 to 1.5 nanometers.

The materials are chosen so that the magnetization of precessional spin current magnetic layer 550 can be set independently while also controlling the out of plane magnetization component of the PSC layer that impacts the freelayer switching performance.

Figure 11:
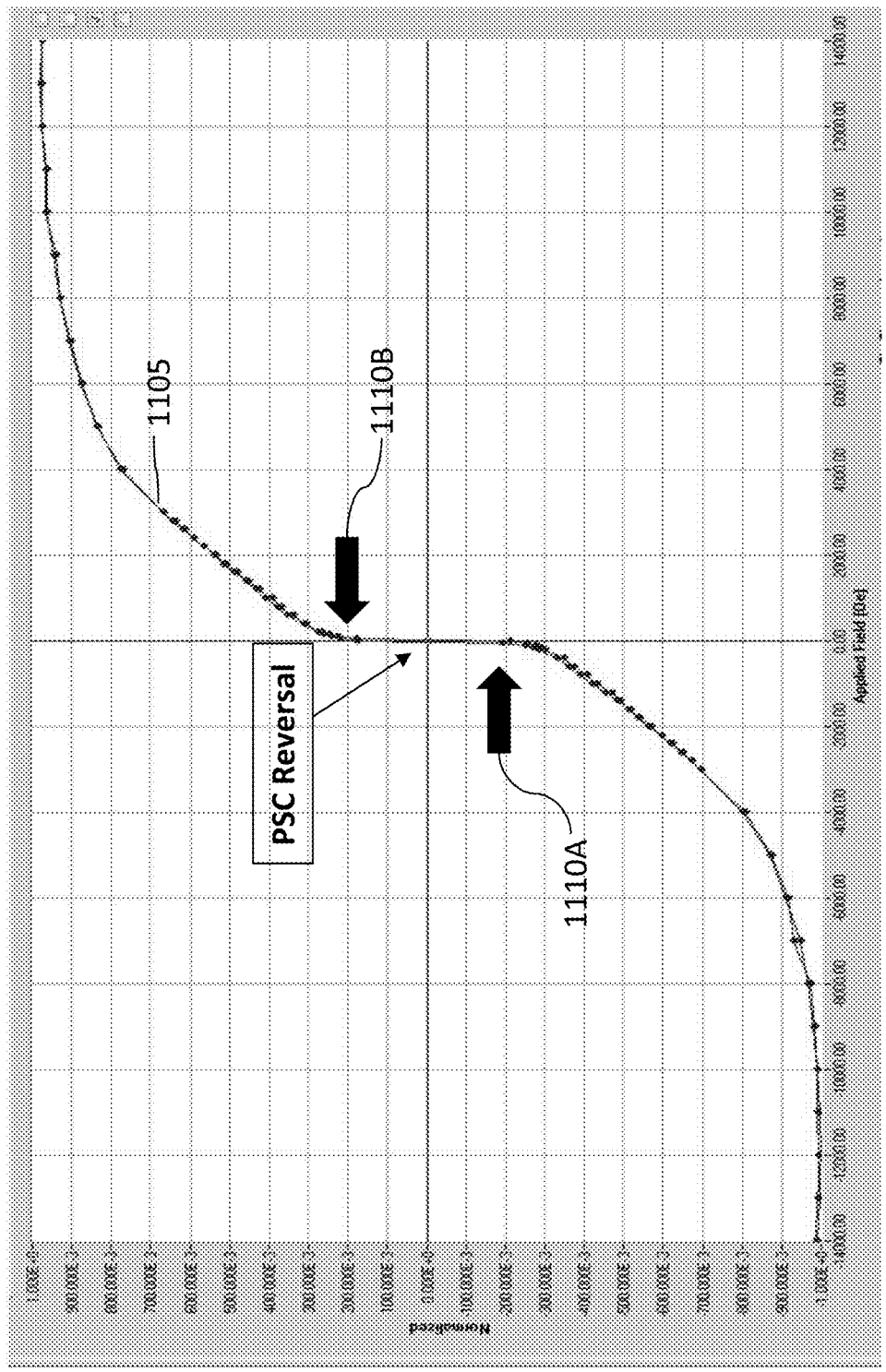
FIG. 11 is a graph of the thin film vibrating sample magnetometer (VSM) major hysteresis loop data for various perpendicular magnetic tunnel junction devices.

FIG. 11 is a graph of the thin film vibrating sample magnetometer (VSM) major hysteresis loop data for perpendicular magnetic tunnel junction devices having a precessional spin current magnetic layer 550. To obtain this VSM) major hysteresis loop (labeled as 1105 in FIG. 11), a DC field was applied. The applied field started at −14000 Oersteds, which then decreased to 0.00 Oersteds, before rising to +14000 Oersteds. The applied field was then decreased steadily from +14000 Oersteds to 0.00 Oersteds, before increasing to −14000 Oersteds. Positive and negative signs of the DC applied field indicate in-plane applied field directions of the field sweep. VSM measurements, shown as normalized magnetic moment on the Y axis of the graph in FIG. 11, were taken with the DC magnetic field applied in the plane of the sample, i.e., along the hard axis of the magnetic tunnel junction 530. The sharp transition around zero applied field (zero Oersteds), pointed to by arrows 1110A and 1110B, indicates that precessional spin current magnetic layer 550 is in-plane magnetized, i.e., magnetized along the easy axis.

Figure 12:
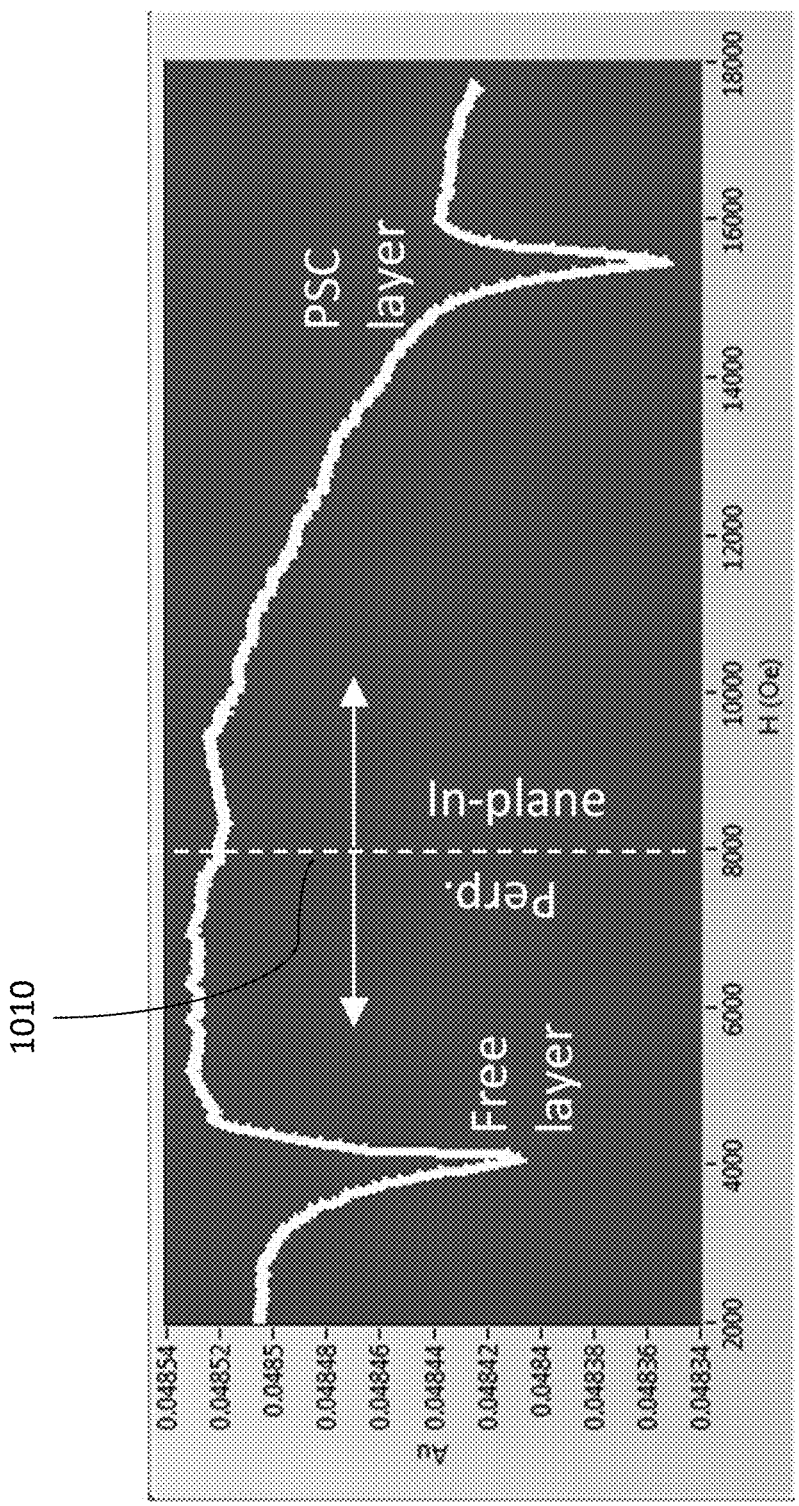
FIG. 12 is a graph illustrating ferromagnetic resonance (FMR) of an MRAM device having a precessional spin current magnetic layer.

FIG. 12 shows the ferromagnetic resonance of a magnetic tunnel junction device 500 having precessional spin current magnetic layer 550 measured at twenty four (24) GHz. The magnetic field was applied in perpendicular direction. Dashed line 1010 at 8000 Oersteds indicates the region boundary $\omega/\gamma$ ~8.0 kGauss at 24 GHz between in-plane precessional spin current magnetic layer 550 and perpendicular magnetized free magnetic layer 536. According to the resonance equation: $\omega/\gamma = H_{res} - 4\pi M_{eff}$, resonance of precessional spin current magnetic layer 550 indicates strong in-plane magnetization. The effective magnetization values show effective perpendicular anisotropy of the free layer ($4\pi M_{eff}$~−4.0 kGauss) and strong effective in-plane anisotropy of the PSC layer ($4\pi M_{eff}$~7.5 kGauss).

An alternative embodiment is shown in FIG. 13. In this embodiment, magnetic device 1300 has had its MTJ stack inverted with respect to the embodiment shown in FIG. 5. In particular, magnetic device 1300 includes a seed layer 1370. Precessional spin current magnetic layer 1350 is placed over seed layer 1370. Precessional spin current magnetic layer 1350 can comprise any of the embodiments described in the context of FIGS. 5 and 7-9, with the layers inverted. As an example, precessional spin current magnetic layer 1350 can comprise a magnetic NiFe permalloy layer 547 over seed layer 1370, Ru layer 1345 over NiFe permalloy layer 547, and magnetic Fe layer over Ru layer 1345. As discussed, NiFe permalloy layer 547 can be replaced with other face centered materials without departing from the scope of the teachings of the patent document.

Nonmagnetic spacer 1340 is placed over PSC layer 1350. Nonmagnetic spacer 1340 has the same properties, construction and characteristics as nonmagnetic spacer 340 and 540, discussed above. MTJ 1330 is placed over nonmagnetic spacer 1340. MTJ 1330 is generally constructed of free layer 1336 (which is placed over nonmagnetic spacer 1340) and reference layer 1332. Free layer 1336 and reference layer 1332 are spatially separated from each other by tunneling barrier layer 1334, which is made of an insulating material such as MgO. As above, MTJ 1330 as a perpendicular MTJ in that the magnetic direction of both reference layer and free layer are perpendicular to their respective planes. As discussed with respect to other embodiments, free magnetic layer 1336 design may include magnetization of the free layer 1336 pointing a few degrees away from its perpendicular axis. The tilted angle of the free layer magnetization can be due to interaction with the PSC magnetic layer 1350 or due to magnetocrystalline anisotropy, will additionally help switching of the free layer magnetization by improving the initiation of the switching. Ferromagnetic coupling layer 1328 is placed over reference layer 1332. A synthetic antiferromagnetic (SAF) layer 1326 is disposed over ferromagnetic coupling layer 1328. An antiferromagnetic coupling layer 1324 is placed over SAF layer 1326. Another synthetic antiferromagnetic layer 1322 is placed over antiferromagnetic coupling layer 1324. Note that SAF layer 1326 technically also includes ferromagnetic coupling layer 1328 and reference layer 1332, but are shown separately here for explanation purposes. SAF layers 1326 and 1322 also perpendicular magnetic directions. Finally, capping layer 1320 is placed over SAF layer 1320. Current can be provided by a current source 1374. Other than the ordering of the layers, magnetic device operates in the same manner as described with respect to the embodiment shown in FIGS. 5 and 7. Thus, just as shown in FIGS. 5 and 7, PSC magnetic layer 1350 rotates in such a way that spin transfer torque 310 is applied in a beneficial manner throughout the entire precession cycle of free layer 1336.

All of the layers of devices 300, 500, 600, 700 and 1300 illustrated in FIGS. 5, 7-9 and 13 can be formed by a thin film sputter deposition system as would be appreciated by one skilled in the art. The thin film sputter deposition system can include the necessary physical vapor deposition (PVD) chambers, each having one or more targets, an oxidation chamber and a sputter etching chamber. Typically, the sputter deposition process involves a sputter gas (e.g., argon, krypton, xenon or the like) with an ultra-high vacuum and the targets can be made of the metal or metal alloys to be deposited on the substrate. Thus, when the present specification states that a layer is placed over another layer, such layer could have been deposited using such a system. Other methods can be used as well. It should be appreciated that the remaining steps necessary to manufacture MTJ stack 300 are well-known to those skilled in the art and will not be described in detail herein so as not to unnecessarily obscure aspects of the disclosure herein.

It should be appreciated to one skilled in the art that a plurality of MTJ structures 300 can be manufactured and provided as respective bit cells of an STT-MRAM device. In other words, each MTJ stack 300, 500, 600, 700 and 1300 can be implemented as a bit cell for a memory array having a plurality of bit cells.

The above description and drawings are only to be considered illustrative of specific embodiments, which achieve the features and advantages described herein. Modifications and substitutions to specific process conditions can be made. Accordingly, the embodiments in this patent document are not considered as being limited by the foregoing description and drawings.

What is claimed is:

1. A method of manufacturing a magnetic device over a substrate, comprising:
    forming a synthetic antiferromagnetic structure in a first plane, the synthetic antiferromagnetic structure comprising a magnetic reference layer, the magnetic reference layer having a magnetization vector that is perpendicular to the first plane and having a fixed magnetization direction;
    forming a non-magnetic tunnel barrier layer in a second plane and over the magnetic reference layer;
    forming a free magnetic layer in a third plane and over the non-magnetic tunnel barrier layer, the free magnetic layer having a magnetization vector that is perpendicular to the third plane and having a magnetization direction that can precess from a first magnetization direction to a second magnetization direction, the magnetic reference layer, the non-magnetic tunnel barrier layer and the free magnetic layer forming a magnetic tunnel junction;
    forming a non-magnetic spacer in a fourth plane and over the free magnetic layer, the non-magnetic spacer comprising MgO;
    forming a precessional spin current magnetic layer in a fifth plane that is physically separated from the free magnetic layer and coupled to the free magnetic layer by the non-magnetic spacer, the precessional spin current magnetic layer having a magnetization vector with a magnetization component that is located within the fifth plane and can freely rotate in any magnetic direction in the fifth plane, the precessional spin current magnetic layer comprising an Fe layer, an Ru layer, and a face centered cubic (fcc) crystal structure layer comprising a material having a fcc crystal structure, the Fe layer being disposed over the non-magnetic spacer, the Ru layer being disposed over the Fe layer, and the fcc crystal structure layer being disposed over the Ru layer; and
    forming a capping layer in a sixth plane and over the precessional spin current magnetic layer.

2. The method of claim 1, wherein electrical current is directed through the capping layer, the precessional spin current magnetic layer, the non-magnetic spacer, the free magnetic layer, the non-magnetic tunnel barrier layer, and the magnetic reference layer, wherein electrons of the electrical current are aligned in a magnetic direction of the precessional spin current magnetic layer; and
    a magnetization direction of the precessional spin current magnetic layer is free to follow precession of a magnetization direction of the free magnetic layer, thereby causing spin transfer torque to assist switching of the magnetization vector of the free magnetic layer.

3. The method of claim 1, wherein a magnetization direction of the magnetization vector of the precessional spin current magnetic layer is in the fifth plane.

4. The method of claim 1, wherein a magnetization direction of the precessional spin current magnetic layer has a magnetization component in the fifth plane which can freely rotate in the fifth plane.

5. The method of claim 1, wherein the material having the fcc crystal structure is permalloy comprising nickel (Ni) and iron (Fe).

6. The method of claim 1, wherein the capping layer comprises a layer of TaN.

7. The method of claim 1, wherein the precessional spin current magnetic layer further comprises a CoFeB layer disposed over the Fe layer and under the fcc crystal structure layer.

8. The method of claim 7, wherein the material having the fcc crystal structure is permalloy comprising nickel (Ni) and iron (Fe).

9. The method of claim 8, wherein the capping layer comprises a layer of TaN.

10. The method of claim 1, wherein the precessional spin current magnetic layer further comprises a first CoFeB layer and the fcc crystal structure layer comprising the material having the fcc crystal structure and a second CoFeB layer, the Fe layer being disposed over the non-magnetic spacer, the Ru layer being disposed over the Fe layer, the first CoFeB layer being disposed over the Fe layer, the fcc crystal structure layer being disposed over the first CoFeB layer, and the second CoFeB layer being disposed over the fcc crystal structure layer.

11. The method of claim 10, wherein the material having the fcc crystal structure is permalloy comprising nickel (Ni) and iron (Fe).

12. The method of claim 11, wherein the capping layer comprises a layer of TaN.

13. The method of claim 11, wherein the capping layer comprises a layer of MgO.

14. The method of claim 11, wherein the capping layer comprises a layer Ru.

15. The method of claim 1, wherein the material having the fcc crystal structure is a NiFe layer, and the precessional spin current magnetic layer further comprises a layer being disposed over the NiFe layer.

16. The method of claim 15, wherein the layer disposed over the NiFe layer comprises CoFeB.

17. The method of claim 1, wherein the precessional spin current magnetic layer is magnetically coupled to the free magnetic layer.

18. The method of claim 1, wherein the precessional spin current magnetic layer is electronically coupled to the free magnetic layer.

19. The method of claim 1, wherein precession of the precessional spin current magnetic layer is synchronized to precession of the free magnetic layer.

20. The method of claim 1, wherein the precessional spin current magnetic layer has a rotation frequency greater than zero.

21. The method of claim 1, wherein the free magnetic layer has an effective magnetic anisotropy such that its easy magnetization axis points away from a perpendicular direction and forms an angle with respect to its perpendicular plane.

* * * * *